US012609671B2

(12) United States Patent
Chauhan et al.

(10) Patent No.: US 12,609,671 B2
(45) Date of Patent: Apr. 21, 2026

(54) HIGH Q ELECTROACOUSTIC RESONATOR

(71) Applicant: RF360 Singapore Pte. Ltd., Singapore (SG)

(72) Inventors: Vikrant Chauhan, Petershausen (DE); Markus Mayer, Wolfratshausen (DE); Thomas Forster, Munich (DE); Philipp Geselbracht, Haar (DE); Manuel Sabbagh, Dorfen (DE); Stefan Ammann, Grosskarolinenfeld (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 96 days.

(21) Appl. No.: 18/608,781

(22) Filed: Mar. 18, 2024

(65) Prior Publication Data

US 2025/0293662 A1 Sep. 18, 2025

(51) Int. Cl.
| | |
|---|---|
| *H03H 9/02* | (2006.01) |
| *H03H 3/08* | (2006.01) |
| *H03H 9/25* | (2006.01) |
| *H03H 9/64* | (2006.01) |

(52) U.S. Cl.
CPC .......... *H03H 9/02992* (2013.01); *H03H 3/08* (2013.01); *H03H 9/25* (2013.01); *H03H 9/6489* (2013.01)

(58) Field of Classification Search
CPC .... H03H 9/145; H03H 9/6413; H03H 9/6483; H03H 9/72
See application file for complete search history.

(56) References Cited

U.S. PATENT DOCUMENTS

| | | | | |
|---|---|---|---|---|
| 7,939,989 | B2 * | 5/2011 | Solal | H03H 9/1452 |
| | | | | 310/313 C |
| 11,177,791 | B2 * | 11/2021 | Solal | H03H 9/6489 |
| 2013/0051588 | A1 * | 2/2013 | Ruile | H03H 9/1457 |
| | | | | 29/25.35 |

(Continued)

FOREIGN PATENT DOCUMENTS

| | | |
|---|---|---|
| CN | 115276596 A | 11/2022 |
| JP | H11191720 A | 7/1999 |

(Continued)

OTHER PUBLICATIONS

Partial International Search Report—PCT/SG2025/050108—ISA/EPO—Jun. 11, 2025.

(Continued)

*Primary Examiner* — Quan Tra
(74) *Attorney, Agent, or Firm* — Polsinelli

(57) ABSTRACT

Aspects include high q resonator devices and associated systems and methods. In one aspect, a device includes first and second busbars. The device includes a first electrode finger coupled to the first busbar and extending in a first direction towards the second busbar without touching the second busbar, where the first electrode finger comprises a finger tip having a first shape, a first stub electrode finger coupled to the second busbar and extending in a second direction opposite the first direction towards the finger tip of the first electrode finger, where the first stub electrode finger comprises a first end coupled to the second busbar and a second end, and where the second end comprises a stub tip having a second shape different than the first shape.

20 Claims, 17 Drawing Sheets

(56)                    References Cited

U.S. PATENT DOCUMENTS

| | | | |
|---|---|---|---|
| 2013/0106536 A1* | 5/2013 | Miura ..................... | H03H 3/08 |
| | | | 333/195 |
| 2022/0149813 A1 | 5/2022 | Solal et al. | |
| 2022/0341881 A1* | 10/2022 | Ballandras ........... | G01K 11/265 |
| 2023/0387882 A1* | 11/2023 | Tsukada ................. | H03H 9/145 |
| 2024/0030891 A1* | 1/2024 | Nozoe ............... | H03H 9/02157 |
| 2025/0015781 A1* | 1/2025 | Daimon ............... | H03H 9/0504 |
| 2025/0226812 A1* | 7/2025 | Huck .................... | H03H 9/145 |

FOREIGN PATENT DOCUMENTS

| | | | |
|---|---|---|---|
| JP | 2004343259 A | 12/2004 |
| WO | 2015005267 A1 | 1/2015 |
| WO | 2019197086 A1 | 10/2019 |
| WO | 2023142483 A1 | 8/2023 |

OTHER PUBLICATIONS

International Search Report and Written Opinion PCT/SG2025/
050108 ISA/EPO Oct. 13, 2025.

* cited by examiner

Figure 6:
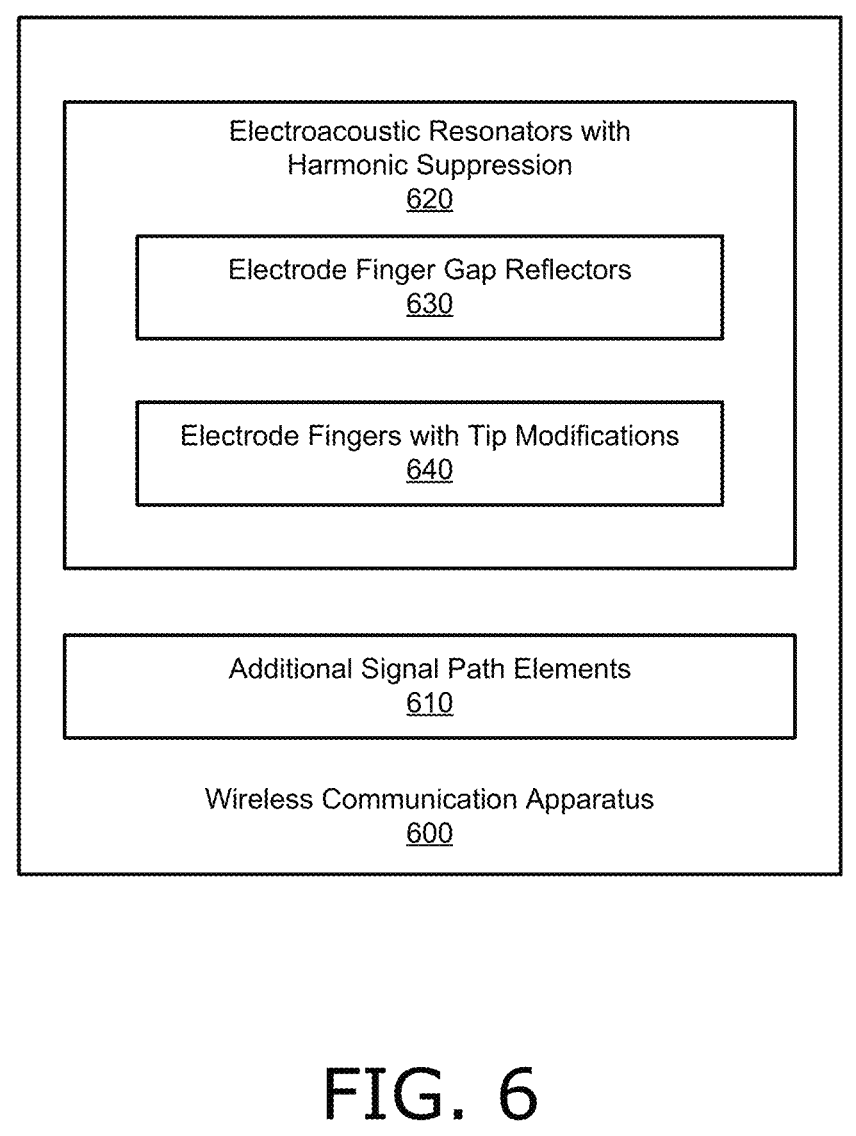

Electroacoustic Resonators with
Harmonic Suppression
620

Electrode Finger Gap Reflectors
630

Electrode Fingers with Tip Modifications
640

Additional Signal Path Elements
610

Wireless Communication Apparatus
600

Second
Electrode
Fingers
712

Electrode
Finger
Tips
713

Gap
Reflectors
720

First
Electrode
Fingers
710

Electrode
Finger
Tips
713

1200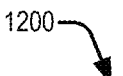

1202

Fabricate a metallization layer mask, the metallization layer mask comprising: a first electrode finger shape extending in a first direction and having a first end coupled to a first busbar section and a second end, wherein the second end comprises a finger tip having a first shape; and a first stub electrode finger shape extending in a second direction opposite the first direction towards the finger tip of the first electrode finger shape, wherein the first stub electrode finger shape comprises a first end coupled to a second busbar section and a second end, and wherein the second end comprises a stub tip having a second shape different than the first shape; and

1204

Fabricate a metallization layer of the electroacoustic resonator using the metallization layer mask

FIG. 12

HIGH Q ELECTROACOUSTIC RESONATOR

FIELD

The present disclosure relates generally to wireless communications, and in particular to high-frequency filters that can be implemented with electroacoustic resonators.

BACKGROUND

Electronic devices include traditional computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system).

Wireless communication transceivers used in these electronic devices generally include multiple radio frequency (RF) filters for filtering a signal for a particular frequency or range of frequencies. Electroacoustic devices (e.g., "acoustic filters") are used for filtering high-frequency (e.g., generally greater than 100 MHz) signals in many applications. Using a piezoelectric material as a vibrating medium, acoustic resonators operate by transforming an electrical signal wave that is propagating along an electrical conductor into an acoustic wave that is propagating via the piezoelectric material. The acoustic wave propagates at a velocity having a magnitude that is significantly less than that of the propagation velocity of the electromagnetic wave. Generally, the magnitude of the propagation velocity of a wave is proportional to a size of a wavelength of the wave. Consequently, after conversion of an electrical signal into an acoustic signal, the wavelength of the acoustic signal wave is significantly smaller than the wavelength of the electrical signal wave. The resulting smaller wavelength of the acoustic signal enables filtering to be performed using a smaller filter device. This permits acoustic resonators to be used in electronic devices having size constraints, such as the electronic devices enumerated above (e.g., particularly including portable electronic devices such as cellular phones).

SUMMARY

Aspects of the present disclosure describe elements of filter circuits for wireless communication systems. As described above, electroacoustic resonators can be used in such filter circuits. In some configurations, harmonics of such resonators can be generated incidentally to the desired performance, and such harmonics can interfere with other signals in a wireless communication apparatus. Aspects described herein include structures for suppression of such harmonics.

In one illustrative example, a wireless communication apparatus is provided. The wireless communication apparatus comprises an electroacoustic resonator including: a first busbar; a second busbar; a first electrode finger coupled to the first busbar and extending in a first direction towards the second busbar without touching the second busbar, wherein the first electrode finger includes a finger tip having a first shape; and a first stub electrode finger coupled to the second busbar and extending in a second direction opposite the first direction towards the finger tip of the first electrode finger, wherein the first stub electrode finger includes a first end coupled to the second busbar and a second end, and wherein the second end includes a stub tip having a second shape different than the first shape.

In some aspects, the electroacoustic resonator operates where the first shape is a rectangular shape.

In some aspects, the electroacoustic resonator operates where the first shape includes multiple rectangular stub shape including the rectangular shape.

In some aspects, the electroacoustic resonator operates where the first shape is a triangular shape.

In some aspects, the electroacoustic resonator operates where the first shape includes curves intersecting in a point of the finger tip.

In some aspects, the electroacoustic resonator operates where the first electrode finger further includes a first piston section proximate to the finger tip between a first section and a second section of the first electrode finger.

In some aspects, the electroacoustic resonator operates where the first piston section includes an area of additional thickness compared with a thickness of the first section of the first electrode finger.

In some aspects, the electroacoustic resonator operates where the first piston section includes an area of additional width compared with a width of the first section of the first electrode finger.

In some aspects, the electroacoustic resonator further includes: first gap reflectors parallel to the first busbar and extending in a direction different than the first electrode finger, wherein the first gap reflectors intersect the first electrode finger in a gap between the first busbar and fingers that extend towards the first busbar.

In some aspects, the electroacoustic resonator further includes: second gap reflectors extending in a direction different than the first stub electrode finger, wherein the second gap reflectors intersect the first stub electrode finger in a gap between the second busbar and the first electrode finger.

In some aspects, the electroacoustic resonator operates where the electroacoustic resonator is part of a transmission or reception path of a wireless communication device, and wherein the wireless communication device further includes: an antenna; and an amplifier.

In some aspects, the techniques described herein relate to an electroacoustic resonator including: an electrode finger including a first end coupled to a busbar and an electrode tip positioned away from the busbar in a direction approximately perpendicular to the busbar, the electrode finger further including a first section, a piston section, and a tip section; wherein the first section extends from the first end to a first piston section interface; wherein the piston section extends from the first piston section interface to a second piston section interface; and wherein the tip section extends from the second piston section interface to the electrode tip in a direction perpendicular to the busbar, wherein a width of the tip section at a widest position of the tip section is narrower than a width of the first section at a narrowest position of the first section.

In some aspects, the electroacoustic resonator operates where the tip section has a rectangular shape.

In some aspects, the electroacoustic resonator operates where the tip section includes multiple rectangular stub shape including the rectangular shape.

In some aspects, the electroacoustic resonator operates where the tip section has a triangular shape.

In some aspects, the electroacoustic resonator operates where the tip section includes curves intersecting in a point of the finger tip.

In some aspects, the electroacoustic resonator further includes: gap reflectors parallel to the busbar and extending in a direction different than the electrode finger, wherein the gap reflectors intersect the first electrode finger in a gap between the busbar and electrode fingers that extend towards the busbar without touching the busbar.

In some aspects, the electroacoustic resonator operates where the electroacoustic resonator is part of a transmission or reception path of a wireless communication device, and wherein the wireless communication device further includes: an antenna; and an amplifier.

In some aspects, the techniques described herein relate to a method of manufacturing an electroacoustic resonator, the method including: fabricating a metallization layer mask, the metallization layer mask including: a first electrode finger shape extending in a first direction and having a first end coupled to a first busbar section and a second end, wherein the second end includes a finger tip having a first shape; and a first stub electrode finger shape extending in a second direction opposite the first direction towards the finger tip of the first electrode finger shape, wherein the first stub electrode finger shape includes a first end coupled to a second busbar section and a second end, and wherein the second end includes a stub tip having a second shape different than the first shape; and fabricating a metallization layer of the electroacoustic resonator using the metallization layer mask.

In some aspects, the techniques described herein relate to a method, wherein the metallization layer mask includes a pre-distortion pattern used to generate the second shape of the second end.

In some aspects, the apparatuses described above can include a mobile device with a camera for capturing one or more pictures. In some aspects, the apparatuses described above can include a display for displaying one or more pictures. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF THE DRAWINGS

FIG. 6 is a representation of a wireless communication apparatus including an electroacoustic resonator, in accordance with examples described herein.

FIG. 12 is a functional block diagram of at least a portion of an example of a simplified wireless transceiver circuit in which the filter circuits and associated split resonators may be employed.

DETAILED DESCRIPTION

Figures 1A, 1B:
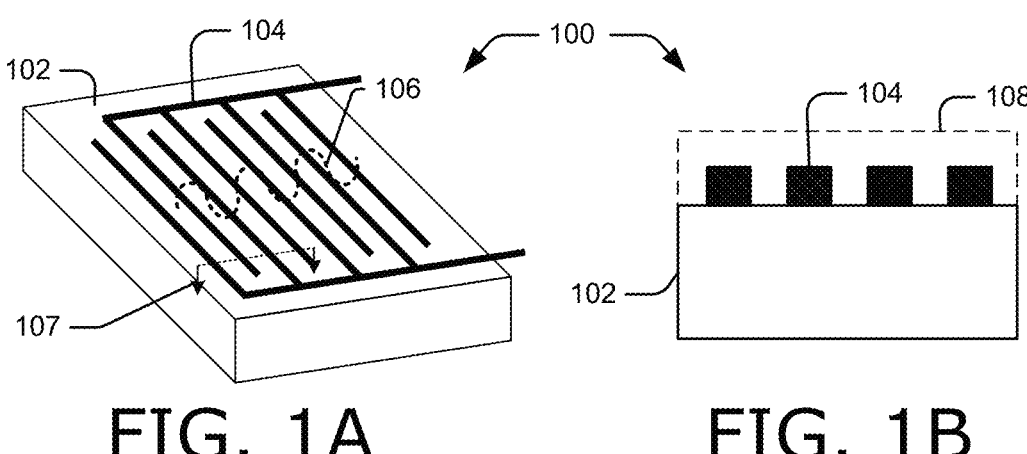
FIG. 1A is a diagram of a perspective view of an example of an electroacoustic device.
FIG. 1B is a diagram of a side view of the electroacoustic device of FIG. 1A.

The detailed description set forth below in connection with the appended drawings is intended as a description of exemplary implementations and is not intended to represent the only implementations in which the invention may be practiced. The term "exemplary" used throughout this description means "serving as an example, instance, or illustration," and should not necessarily be construed as preferred or advantageous over other exemplary implementations. The detailed description includes specific details for the purpose of providing a thorough understanding of the exemplary implementations. In some instances, some devices are shown in block diagram form. Drawing elements that are common among the following figures may be identified using the same reference numerals.

Electroacoustic devices such as surface acoustic wave (SAW) resonators, which employ electrode structures on a surface of a piezoelectric material, are being designed to cover more frequency ranges (e.g., 500 MHz to 6 GHz), to have higher bandwidths (e.g., up to 25%), and to have improved efficiency and performance as designs using such devices become more complex. Additionally, such devices can be included in systems that support transmission, reception, and multiple channels at different frequencies within the same wireless communication apparatus. During operation, such SAW resonators can generate harmonics (e.g., second and third order harmonic signals of a prime signal). Such harmonics can be propagated through parasitic paths to interfere with signals on other signal paths (e.g., a second order harmonic of a signal in a transmission path resonator interfering with a signal in a SAW or bulk acoustic wave (BAW) receive path resonator).

Aspects described herein include structures within SAW resonators that can suppress certain harmonics using adjusted structures within a harmonic resonator, including electrode finger tip modifications in accordance with aspects described herein. In particular, regions at the edges (e.g., tips) of metal fingers impact linear performance of electroacoustic resonators due to nonlinearity originated from the fields in these regions (e.g., especially second order nonlinearities). Aspects described herein modify these regions in order to reduce the second order nonlinearities and improve device performance. Such improvements can be provided with little or no increase in device area due to the modification of the device shape at the electrode tips rather than a change in the electrode finger size or configuration.

Additional details are provided in the context of the figures below.

FIG. 1A is a diagram of a perspective view of an example of an electroacoustic device 100. The electroacoustic device 100 may be configured as or be a portion of a SAW resonator. In certain descriptions herein, the electroacoustic device 100 may be referred to as a SAW resonator. However, there may be other electroacoustic device types (e.g., BAW or TFBAR) that may be constructed based on the principles described herein. The electroacoustic device 100 includes an electrode structure 104, that may be referred to as an interdigital transducer (IDT), on the surface of a piezoelectric material 102. The electrode structure 104 generally includes first and second comb shaped electrode structures (conductive and generally metallic) with electrode fingers extending from two busbars towards each other arranged in an interlocking manner in between two busbars (e.g., arranged in an interdigitated manner). An electrical signal excited in the electrode structure 104 (e.g., applying an AC voltage) is transformed into an acoustic wave 106 that propagates in a particular direction via the piezoelectric material 102. The acoustic wave 106 is transformed back into an electrical signal and provided as an output. In many applications, the piezoelectric material 102 has a particular crystal orientation such that when the electrode structure 104 is arranged relative to the crystal orientation of the piezoelectric material 102, the acoustic wave mainly propagates in a direction perpendicular to the direction of the fingers (e.g., parallel to the busbars). In various examples, circuits described herein having such structures can include microelectroacoustic filters implemented with micro-electromechanical structure (MEMS) technology. MEMS technology includes miniature physical structures that can have both mechanical (e.g., vibrational or acoustic) component characteristics as well as electrical characteristics. In some examples, the resonators described herein can be built using MEMS fabrication techniques to generate structures with dimensions less than one micrometer.

FIG. 1B is a diagram of a side view of the electroacoustic device 100 of FIG. 1A along a cross-section 107 shown in FIG. 1A. The electroacoustic device 100 is illustrated by a simplified layer stack including a piezoelectric material 102 with an electrode structure 104 disposed on the piezoelectric material 102. The electrode structure 104 is conductive and generally formed from metallic materials. The piezoelectric material may be formed from a variety of materials such as quartz, lithium tantalate (LiTaO3), lithium niobate (LiNbO3), doped variants of these, or other piezoelectric materials. It should be appreciated that more complicated layer stacks including layers of various materials may be possible within the stack. For example, optionally, a temperature compensation layer 108 denoted by the dashed lines may be disposed above the electrode structure 104. The piezoelectric material 102 may be extended with multiple interconnected electrode structures disposed thereon to form a multi-resonator filter or to provide multiple filters. While not illustrated, when provided as an integrated circuit component, a cap layer may be provided over the electrode structure 104. The cap layer is applied so that a cavity is formed between the electrode structure 104 and an under surface of the cap layer. Electrical vias or bumps that allow the component to be electrically connected to connections on a substrate (e.g., via flip-chip or other techniques) may also be included.

Figure 2A:
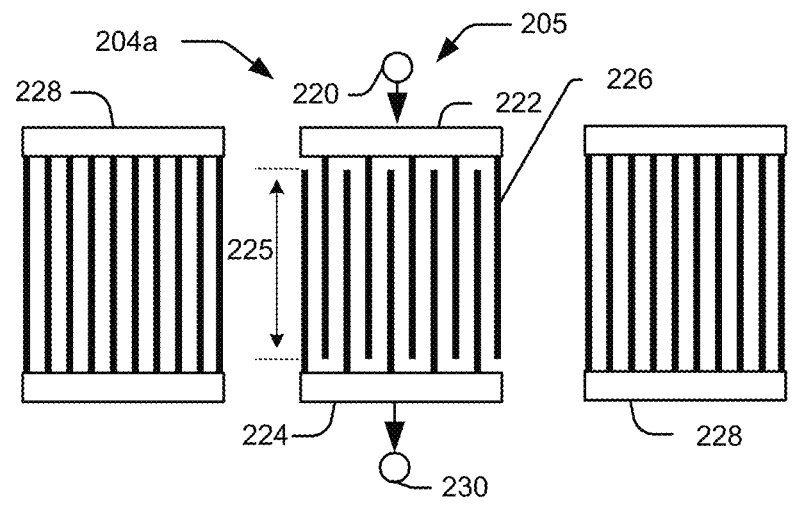
FIG. 2A is a diagram of a top view of an example of an electrode structure of an electroacoustic device.

FIG. 2A is a diagram of a top view of an example of an electrode structure 204a of an electroacoustic device 100. The electrode structure 204a has an IDT 205 that includes a first busbar 222 (e.g., first conductive segment or rail) electrically connected to a first terminal 220 and a second busbar 224 (e.g., second conductive segment or rail) spaced from the first busbar 222 and connected to a second terminal 230. A plurality of conductive fingers 226 are connected to either the first busbar 222 or the second busbar 224 in an interdigitated manner. Fingers 226 connected to the first busbar 222 extend towards the second busbar 224 but do not connect to the second busbar 224 so that there is a small gap between the ends of these fingers 226 and the second busbar 224. Likewise, fingers 226 connected to the second busbar 224 extend towards the first busbar 222 but do not connect to the first busbar 222 so that there is a small gap between the ends of these fingers 226 and the first busbar 222.

In the direction along the busbars, there is an overlap region including a central region where a portion of one finger overlaps with a portion of an adjacent finger as illustrated by the central region 225. The central region 225 including the overlap may be referred to as the aperture, track, or active region where electric fields are produced between fingers 226 to cause an acoustic wave to propagate in the central region 225 of the piezoelectric material 102. The periodicity of the fingers 226 is referred to as the pitch of the IDT. The pitch may be indicted in various ways. For example, in certain aspects, the pitch may correspond to a magnitude of a distance between fingers in the central region 225. The distance may be defined, for example, as the distance between center points of each of the fingers (and may be generally measured between a right (or left) edge of one finger and the right (or left) edge of an adjacent finger when the fingers have uniform thickness). In certain aspects, an average of distances between adjacent fingers may be used for the pitch. The frequency at which the piezoelectric material vibrates within a given stack (e.g., a full stack including a piezoelectric layer and electrode structure combination) is a self-resonance (also called a "main-resonance") frequency of the electrode structure 204a. The frequency is determined at least in part by the pitch of the IDT 205 and other properties of the electroacoustic device 100.

The IDT 205 is arranged between two reflectors 228 which reflect the acoustic wave back towards the IDT 205 for the conversion of the acoustic wave into an electrical signal via the IDT 205 in the configuration shown and to prevent losses (e.g., confine and prevent escaping acoustic waves). Each reflector 228 has two busbars and a grating structure of conductive fingers that each connect to both busbars. The pitch of the reflector may be similar to or the same as the pitch of the IDT 205 to reflect acoustic waves in the resonant frequency range. But many configurations are possible.

When converted back to an electrical signal, the converted electrical signal may be provided as an output such as one of the first terminal 220 or the second terminal 230 while the other terminal may function as an input.

A variety of electrode structures are possible. FIG. 2A may generally illustrate a one-port configuration. Other 2-port configurations are also possible. For example, the electrode structure 204a may have an input IDT 205 where each terminal 220 and 230 functions as an input. In such an event, an adjacent output IDT (not illustrated) that is positioned between the reflectors 228 and adjacent to the input IDT 205 may be provided to convert the acoustic wave propagating in the piezoelectric material 102 to an electrical signal to be provided at output terminals of the output IDT.

Figure 2B:
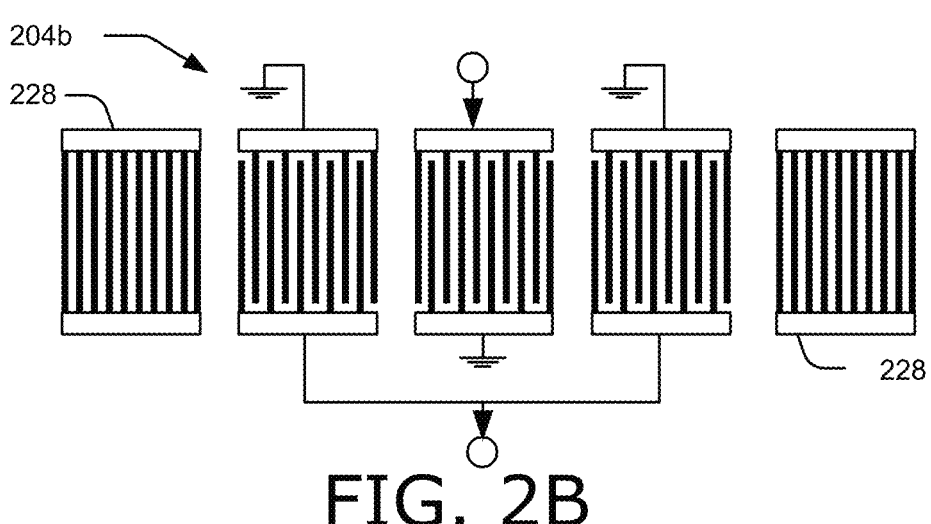
FIG. 2B is a diagram of a top view of another example of an electrode structure of an electroacoustic device.

FIG. 2B is a diagram of a top view of another example of an electrode structure 204b of an electroacoustic device 100. Such a dual-mode SAW (DMS) electrode structure 204b is illustrated that is a structure which may induce multiple resonances. The electrode structure 204b includes multiple IDTs along with reflectors 228 connected as illustrated. The electrode structure 204b is provided to illustrate the variety of electrode structures that principles described herein may be applied to including the electrode structures 204a and 204b of FIGS. 2A and 2B.

It should be appreciated that while a certain number of fingers 226 are illustrated, the number of actual fingers and lengths and width of the fingers 226 and busbars may be different in an actual implementation. Such parameters depend on the particular application and desired frequency of the filter. In addition, a SAW filter may include multiple interconnected electrode structures each including multiple IDTs to achieve a desired passband (e.g., multiple interconnected resonators or IDTs to form a desired filter transfer function).

Figure 3A:
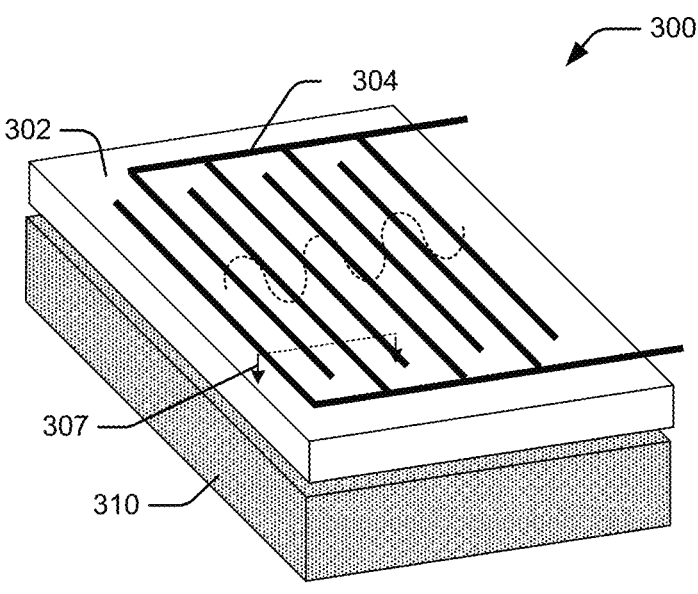
FIG. 3A is a diagram of a perspective view of another example of an electroacoustic device.

FIG. 3A is a diagram of a perspective view of another example of an electroacoustic device 300. The electroacoustic device 300 (e.g., that may be configured as or be a part of a SAW resonator) is similar to the electroacoustic device 100 of FIG. 1A but has a different layer stack. In particular, the electroacoustic device 300 includes a thin piezoelectric material 302 that is provided on a substrate 310 (e.g., silicon). The electroacoustic device 300 may be referred to as a thin-film SAW resonator (TF-SAW) in some cases. Based on the type of piezoelectric material 302 used (e.g., typically having higher coupling factors relative to the electroacoustic device 100) and a controlled thickness of the piezoelectric material 302, the particular acoustic wave modes excited may be slightly different than those in the electroacoustic device 100 of FIG. 1A. Based on the design (thicknesses of the layers, and selection of materials, etc.), the electroacoustic device 300 may have a higher Q-factor as compared to the electroacoustic device 100 of FIG. 1A. The piezoelectric material 302, for example, may be Lithium tantalate (LiTaO3) or some doped variant. Another example of a piezoelectric material 302 for FIG. 3A may be Lithium niobate (LiNbO3). In general, the substrate 310 may be substantially thicker than the piezoelectric material 302 (e.g., potentially on the order of 50 to 100 times thicker as one example—or more). The substrate 310 may include other layers (or other layers may be included between the substrate 310 and the piezoelectric material 302).

Figure 3B:
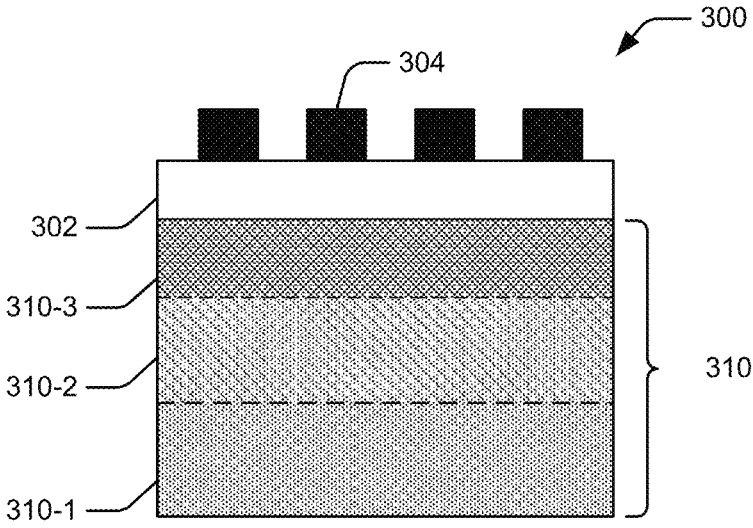
FIG. 3B is a diagram of a side view of the electroacoustic device of FIG. 3A.

FIG. 3B is a diagram of a side view of the electroacoustic device 300 of FIG. 3A showing an exemplary layer stack (along a cross-section 307). In the example shown in FIG. 3B, the substrate 310 may include sublayers such as a substrate sublayer 310-1 (e.g., of silicon) that may have a higher resistance (e.g., relative to the other layers-high resistivity layer). The substrate 310 may further include a trap rich layer 310-2 (e.g., poly-silicon). The substrate 310 may further include a compensation layer 310-3 (e.g., silicon dioxide (SiO2) or another dielectric material) that may provide temperature compensation and other properties. These sub-layers may be considered part of the substrate 310 or their own separate layers. A relatively thin piezoelectric material 302 is provided on the substrate 310 with a particular thickness for providing a particular acoustic wave mode (e.g., as compared to the electroacoustic device 100 of FIG. 1A where the thickness of the piezoelectric material 102 may not be a significant design parameter beyond a certain thickness and may be generally thicker as compared to the piezoelectric material 302 of the electroacoustic device 300 of FIGS. 3A and 3B). The electrode structure 304 is positioned above the piezoelectric material 302. In addition, in some aspects, there may be one or more layers (not shown) possible above the electrode structure 304 (e.g., such as a thin passivation layer).

Based on the type of piezoelectric material, the thickness, and the overall layer stack, the coupling to the electrode structure 304 and acoustic velocities within the piezoelectric material in different regions of the electrode structure 304 may differ between different types of electroacoustic devices such as between the electroacoustic device 100 of FIG. 1A and the electroacoustic device 300 of FIGS. 3A and 3B.

Figure 4:
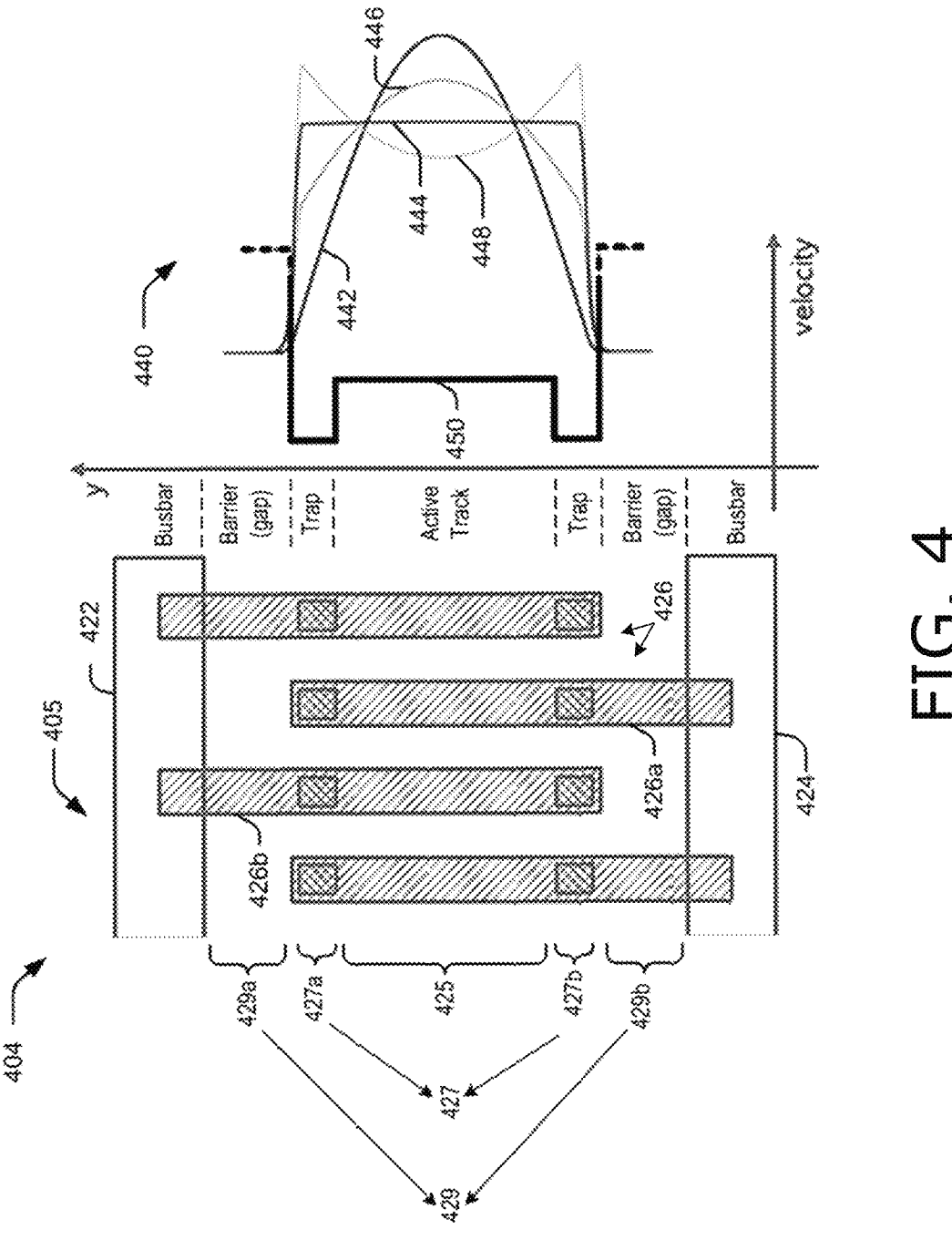
FIG. 4 is a diagram of a portion of an electrode structure of an electroacoustic device aligned with a plot illustrating acoustic velocity profiles in different regions of the electroacoustic device.

FIG. 4 is a diagram of a portion of an electrode structure 404 of an electroacoustic device aligned with a plot illustrating acoustic velocity profiles in different regions of the electroacoustic device. The electrode structure 404 of FIG. 4 shows a portion of an IDT 405 similar to that described with reference to FIG. 2A with a first busbar 422, a second busbar 424, and interdigitated fingers 426. As the angles and frequency position of the transversal acoustic wave modes depend on the directional acoustic wave velocity, in an aspect, the transversal velocity profile within the acoustic track can designed in such a way to reduce transversal acoustic wave modes and promote excitation of the main or fundamental mode. In particular, the electrode structure 404 (and potentially other layers) can be adjusted in different regions of the electrode structure 404 to adjust the transversal velocity profile within the acoustic track to reduce transversal acoustic modes.

The example of FIG. 4 illustrates different regions of the electrode structure 404 that may be designed or structurally altered to adjust the transversal velocity profile. As described with respect to FIG. 2A, a central region 425 (or active track region or aperture) is defined where the main or fundamental mode is generally intended and designed to propagate perpendicular to the fingers 426.

In an aspect, barrier regions 429 (e.g., gap regions) are defined outside the central region 427 that include regions between the first busbar 422 and fingers 426a connected to the opposite second busbar 424. More particularly, the barrier regions 429 include a first barrier region 429a and a second barrier region 429b. The first barrier region 429a is defined between the first busbar 422 and unconnected ends of a first set of fingers 426a connected to the second busbar 424. The second barrier region 429b is defined between the second busbar 424 and unconnected ends of a second set of fingers 426b connected to the first busbar 422. The barrier regions 429 may sometimes correspond to or be referred to as a transversal gap which is included in IDTs to separate metal structures of different potentials (i.e., separate fingers connected to opposite busbars where the busbars have different potentials).

To adjust the transversal velocity profile, the number of fingers per wavelength within the barrier regions 429 (e.g., one finger instead of the two fingers as illustrated in the central region 425) along with the distance or size of the barrier regions 429 are selected (and/or with adjustment of other characteristics within the barrier regions 429) so that there is a higher acoustic wave velocity, particularly higher than in the central region 425. The plot 440 to the right of the electrode structure 404 illustrates relative velocities of each region of the electrode structure 404 where the y-axis represents and is aligned with different regions of the electrode structure 404 along the direction the fingers 426 extend. As illustrated by line 450 (see dashed line portions), the acoustic velocity along the x-axis is higher in the barrier regions 429 as compared to the acoustic velocity in the central region 425 (e.g., active track). In general, as an acoustic wave may tend to propagate more easily where velocity is lower, a relative higher wave velocity may be a barrier for the acoustic wave. A distance/width of the barrier regions 429 (e.g., in some aspects, at least 2-3 micrometers (um) to sufficiently separate metal structures of different potentials. In some aspects, the width of the barrier regions 429 can be as little as 200 nanometers (nm). In other aspects, the width of the barrier regions 429 can be as much as 8-10 um. In further aspects, larger widths can be used, particularly for low-band or HQ-TCF implementations. In some such aspects, the width 429 can be, for example, approximately 15-20 um. In various such aspects, the width is designed to provide a sufficient barrier to limit or prevent acoustic waves from coupling to outside regions.

In addition to the barrier regions 429, further regions referred to as a trap regions 427 are provided at either outer boundary of the central region 425 (e.g., bound on each end) where the fingers 426 overlap. In particular, a first trap region 427a is positioned towards or at a first end (e.g., boundary) of the central region 425 (e.g., active region) and between the first barrier region 429a and the central region 425 (e.g., in a region of the fingers 426 that is towards an end of the first set of fingers 426a that are connected to the second busbar 424 where the region is distal from the second busbar 424). A second trap region 427b is positioned towards or at a second end of the central region 425 (opposite the first end) and between the second barrier region 429b and the central region 425 (e.g., in a region of the fingers that is towards an end of the second set of fingers 426b that are connected to the first busbar 422 where the region is distal from the first busbar 422). The trap regions 427 may correspond to outer edges or outer regions of the central region 425. A structural characteristic in the trap regions 427 different than in the central region 425 is provided to create a region of the electroacoustic device aligned with the trap regions 427 that has a reduced acoustic wave velocity, in particular to be lower than an acoustic wave velocity in the central region 425. Such structural characteristics may include widening the electrode fingers 426 in the trap regions 427 or increasing the height of the electrode fingers 426 in the trap regions 427, but many implementations are possible. In general, an acoustic wave may tend to propagate more easily where velocity is lower. The trap regions 427 with a lower acoustic wave velocity may thereby provide a way to shape the transversal amplitude profile of the fundamental acoustic wave mode. As a result of designing and selecting sizes for the barrier regions 429, the trap regions 427, and the central region 425, the fundamental acoustic wave mode amplitude in the transversal directions (e.g., in the direction of the fingers 426) may be conformed towards a rectangular profile as indicated by line 444 of the plot 440. The rectangular profile caused by the different acoustic wave velocities in the different regions corresponds to a mode where undesired transversal modes are suppressed. Line 442 in the plot 440 corresponds to the fundamental mode amplitude in the transversal direction without trap regions which may lead to undesired transversal modes. Line 446 in the plot 440 corresponds to the fundamental mode amplitude in the transversal direction where the trap regions 427 are insufficiently deep (e.g., acoustic wave is not sufficiently slowed within that region). Although improved, undesired transversal modes may continue to impact performance. Line 448 in the plot 440 corresponds to the fundamental mode amplitude in the transversal direction where the trap regions 427 are too deep. This may also result in undesired transversal acoustic wave modes. By adjusting the characteristics of the barrier regions 429 and the trap regions 427, the fundamental mode amplitude in the transversal direction can be adjusted to conform towards the rectangular profile indicated by line 444 and transversal modes are effectively suppressed. The techniques for providing the barrier regions 429 and the trap regions 427 in such configurations are sometimes referred to a piston mode.

Figures 5A, 5B:
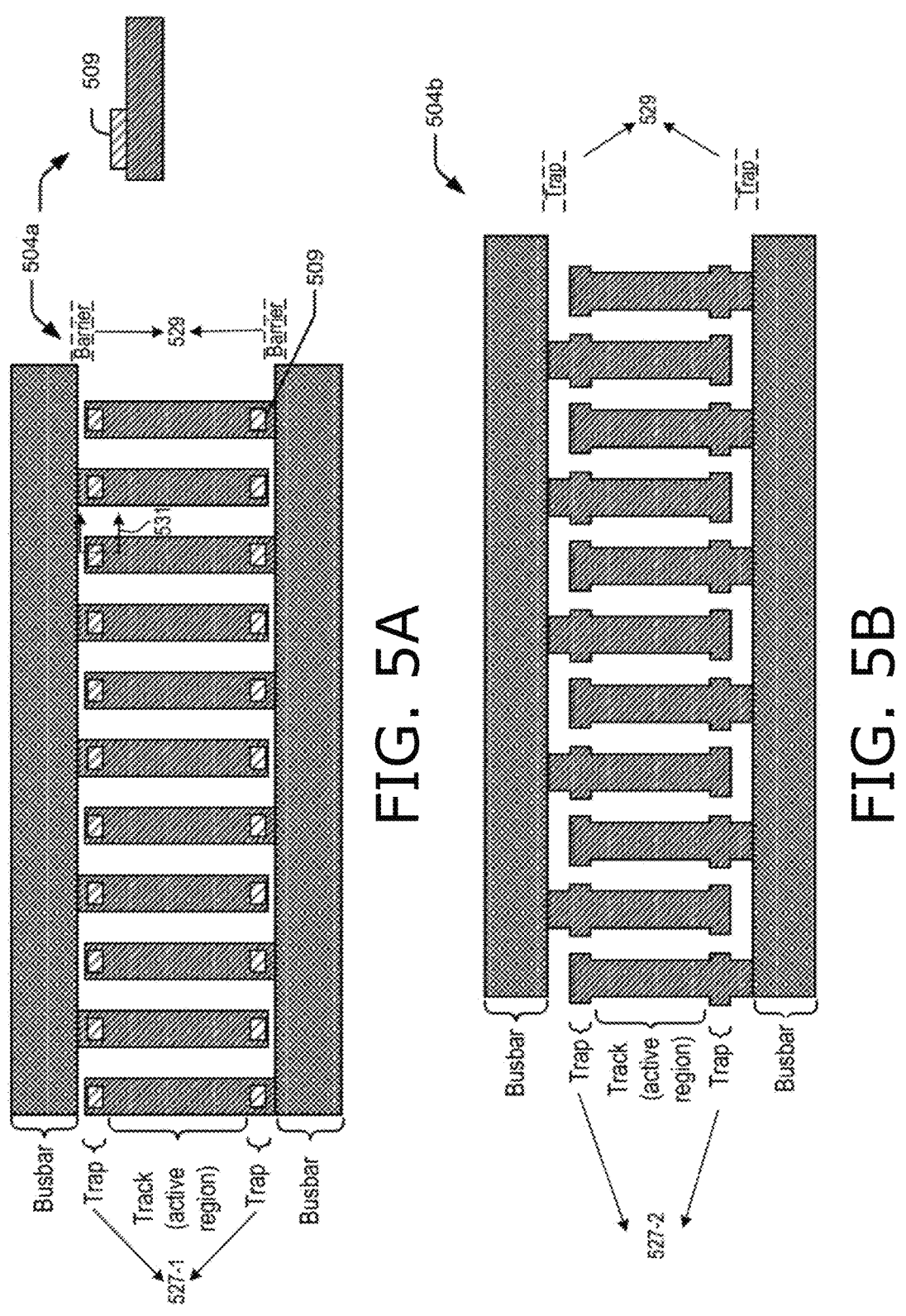
FIGS. 5A and 5B are diagrams of examples of electrode structures that illustrate examples of different implementations of trap regions as defined with reference to FIG. 4.

FIGS. 5A and 5B are diagrams of examples of electrode structures 504a and 504b that illustrate examples of different implementations of trap regions 527-1 and 527-2 as defined with reference to FIG. 4. Barrier regions 529 are denoted but are not particularly illustrated or drawn to scale. Rather, the electrode structures 504a and 504b are provided to illustrate implementations of the trap regions 527-1 (FIG. 5A) and 527-2 (FIG. 5B). For example, in the electrode structure 504a of FIG. 5A, the trap regions 527-1 are illustrated with a portion 509 of the electrode structure 504a having an increased thickness relative to other portions of the active region. A side view is shown on right along a cross-section 531. The increased height may result in a slower acoustic velocity in the trap regions 527-1. In another implementation, as illustrated by the electrode structure 504b of FIG. 5B, the electrode structure 504b within the trap regions 527-2 has a width that is wider as compared to the active region. These wider widths may result in a slower acoustic velocity in the trap regions 527-2. In some implementations, the trap regions 527-2 may have both a width that is wider as compared to the active region along with an increased height (e.g., thickness) as illustrated in FIG. 5A. As such, any techniques described herein for the trap regions 527-2 may be combined. In other implementations, other materials (e.g., a layer of dielectric material) may be positioned over the trap regions 427 (FIG. 4) to reduce an acoustic velocity in the trap regions 427 (e.g., or other types of mass loading). In addition, one or more trimming operations may adjust or have a structural effect in the various regions so that the relative acoustic velocity in the trap regions 427 are reduced relative to the central region 425. Other implementations using different techniques may also be employed such that structural characteristics in the trap regions 427 are adjusted and different than in the central region 425 so that there is reduced acoustic velocity in trap regions 427.

Certain techniques to address these issues for electroacoustic devices may be difficult to implement for higher metallization ratios and higher metal heights (and due to other manufacturing difficulties of such solution) and may increase ohmic losses. In some implementations, metallization ratios can be between 0.45 to 0.7. Aspects described herein can be implemented with such metallization ratios. Lower metallization ratios, which can be metallization ratios below 0.55 as described herein, may be implemented with fewer of the difficulties described above in some implementations. For example, in some aspects, weighted sections formed of increased widths or dots on sections electrode fingers can be more difficult to manufacture with high frequency components and/or a high metallization ratio. In addition, barrier regions 429 as described with reference to FIG. 4 (e.g., including 1 stripper wavelength) may lead to concave slowness for certain configurations such as when using Lithium tantalate based devices as described above with reference to FIG. 3A.

FIG. 6 is a representation of a wireless communication apparatus 600 including an electroacoustic resonator 620, in accordance with examples described herein. The wireless communication apparatus 600 can use various filter elements, including one or more electroacoustic resonators 620, to achieve signal characteristics that meet targets for a given communication system. As described above, transmission and receive paths of a such a wireless communication apparatus can include a plurality of signal (e.g., transmission and receive) path elements, illustrated as including the electroacoustic resonator(s) 620 having harmonic suppression structures, as well as additional signal path elements 610. The additional signal path elements 610 can include low noise amplifiers (LNAs), mixers, transmission lines, filter elements including various different SAW resonators, BAW resonators, and other elements. Under high power loads, a SAW can emit harmonic signals that can follow parasitic paths through the wireless communication apparatus 600 that can interfere with signals in the additional signal path elements 610. Such high power loads can particularly occur in a transmission path after amplification of a signal, at conditioning filters between an amplifier and a transmission antenna.

The electroacoustic resonator 620 includes both electrode finger gap reflectors 630, as well as wave pattern electrode fingers. As discussed above and further below, electroacoustic resonators include electrode fingers. The electrode finger gap reflectors 630 include metallization lines perpendicular to the electrode fingers. The electrode fingers with tip modifications 640 refers to tip shapes at the ends of electrode fingers that are structured to reduce harmonics and thereby improve device operation in accordance with aspects described herein. Such aspects can include tip areas with a reduced size shape when compared with the main portion of the electrode, as well as differences in tip patterns of electrodes compared with tips of stub electrodes as described below. The combination of both the electrode finger gap reflectors 630 and the electrode fingers with tip modifications 640 can result in significantly improved harmonic suppression when compared with each suppression structure without the other. Details of such improvements in performance in a device is illustrated below in FIG. 11. The described structures and techniques may apply to a variety of different types of electroacoustic devices (e.g., BAW devices), but include specific advantages for thin-film SAW electroacoustic devices, and thin-film electroacoustic devices using Lithium tantalate.

Figure 7A:
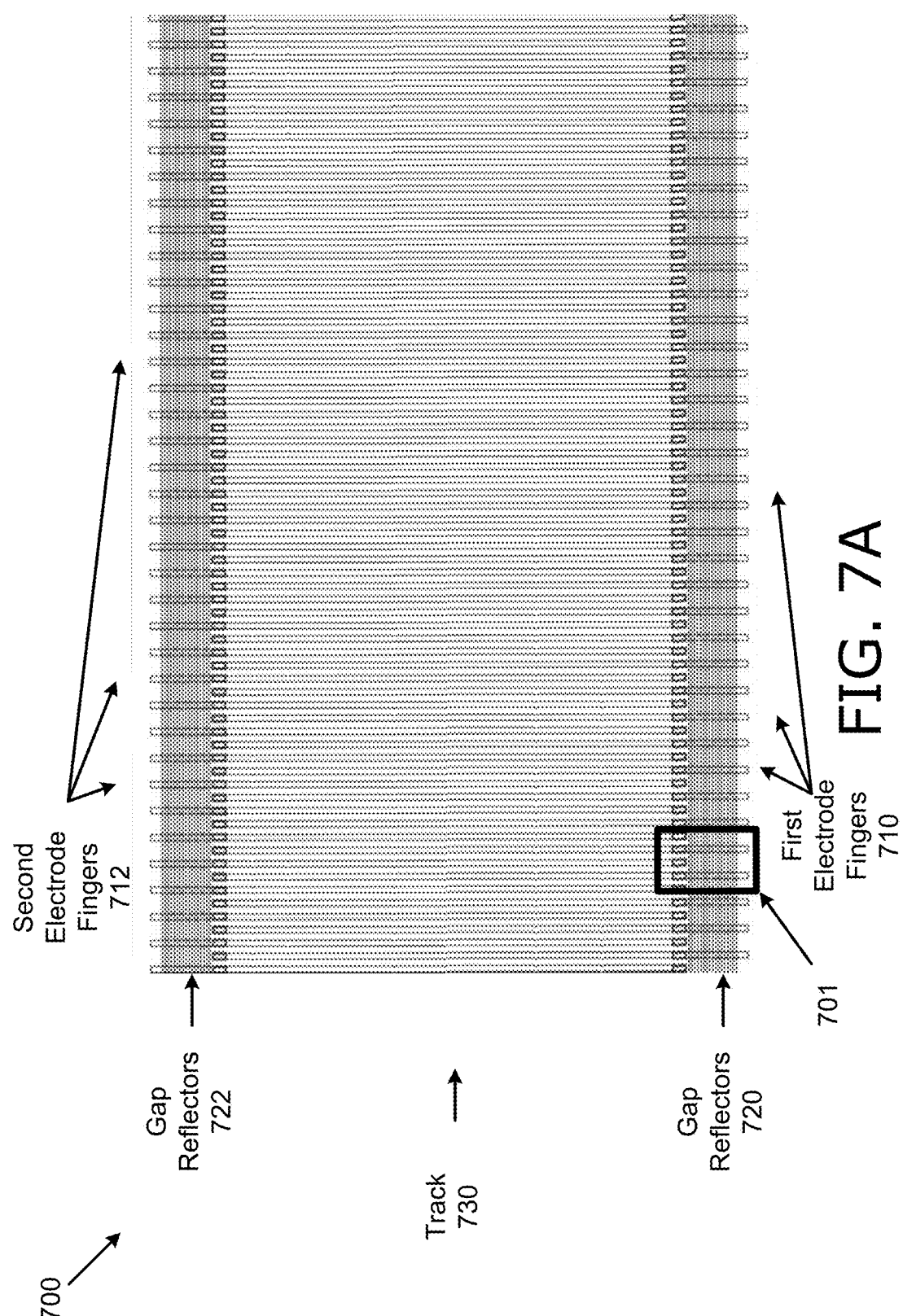
FIG. 7A is a representation of an electroacoustic resonator illustrating aspects of harmonic suppression structures, in accordance with aspects described herein.
Figure 7B:
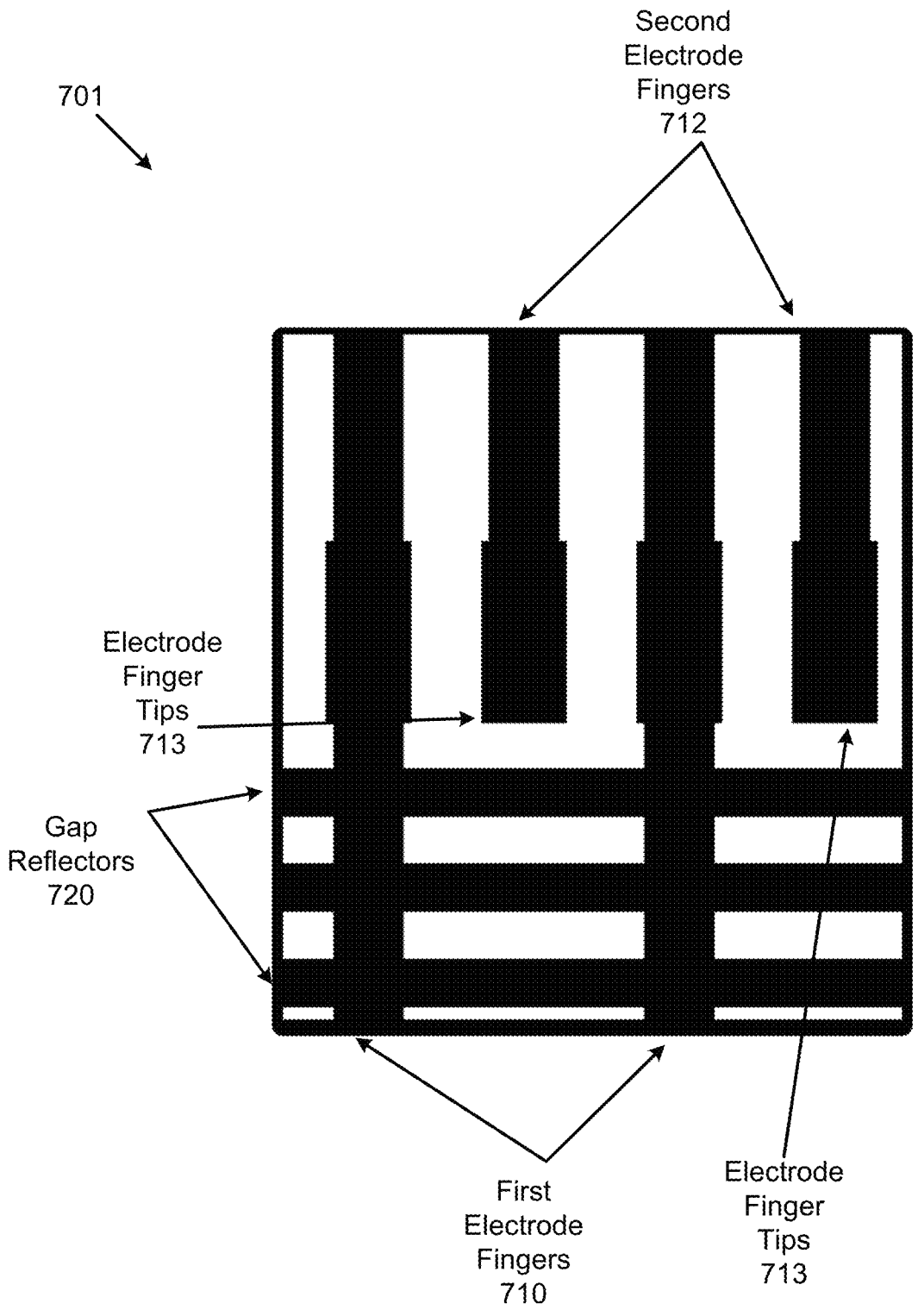
FIG. 7B is a representation of an electroacoustic resonator illustrating aspects of harmonic suppression structures, in accordance with aspects described herein.

FIGS. 8A-B and 9A-D illustrate details of electrode finger tip modifications in accordance with aspects described herein. For clarity, these figures do not include gap reflector details that may be used at a base end of an electrode finger (e.g., an end coupled to a busbar). FIGS. 7A and 7B illustrate aspects of gap reflectors that can be integrated with the tip modifications detailed further below.

FIG. 7A is a representation of an electroacoustic resonator 700. Similar to the resonators described above, the electroacoustic resonator 700 includes first electrode fingers 710 interleaved with adjacent second electrode fingers 712 to form a track 730. The track 730 functions to filter signals using electroacoustic resonance as described above. As described above, transversal waves within the electroacoustic resonator 700 can propagate both through a signal path that includes the electroacoustic resonator 700. To suppress such transversal waves, the electroacoustic resonator 700 includes suppression structures in the form gap reflectors 720 and 722. The gap reflectors 720 and 722 can bound the traps between ends of electrode fingers extending from the opposite busbar, and can operate to dampen transversal waves within such trap.

FIG. 7B is a representation of the area 701 of the electroacoustic resonator 700 illustrating aspects of harmonic suppression structures, in accordance with aspects described herein. The area 701 of FIG. 7B is an enlarged illustration of the area 701 of FIG. 7A. The area 701 includes the portions of the gap reflectors 720, the first electrode fingers 710, and the second electrode fingers 712. The portion of the second electrode fingers 712 shown in the area 701 includes associated electrode finger tips 713 that can be modified in accordance with aspects described herein for harmonic suppression. Additional details of such modifications are described further below. The descriptions below do not show gap reflectors, but in any aspect, gap reflectors such as the gap reflectors 720 can be present between electrode finger tips (e.g., the electrode finger tips 713) and an opposite busbar (not shown in FIGS. 7A and 7B). Similarly, gap reflectors can be present at a first or base section of electrode fingers near a busbar connection, such as the position of the gap reflectors 720 positioned with the illustrated base sections of the first electrode fingers 710 near where the first electrode fingers will couple to a busbar (not shown in FIGS. 7A and 7B).

The gap reflectors (e.g., the gap reflectors 720 and 722) extend in a direction different than the direction the fingers extend (e.g., perpendicular or at some angle). In some aspects, the gap reflectors 720 and 722 can be substantially parallel to the busbars of a device and perpendicular to the electrode fingers that fill the track 730, with the gap reflectors 720 and 722 configured to dampen signals outside of the track 730 as described above. The gap reflectors 720 and 722 are positioned between busbars and tips of electrode fingers extending from the opposite busbar.

Figure 8A:
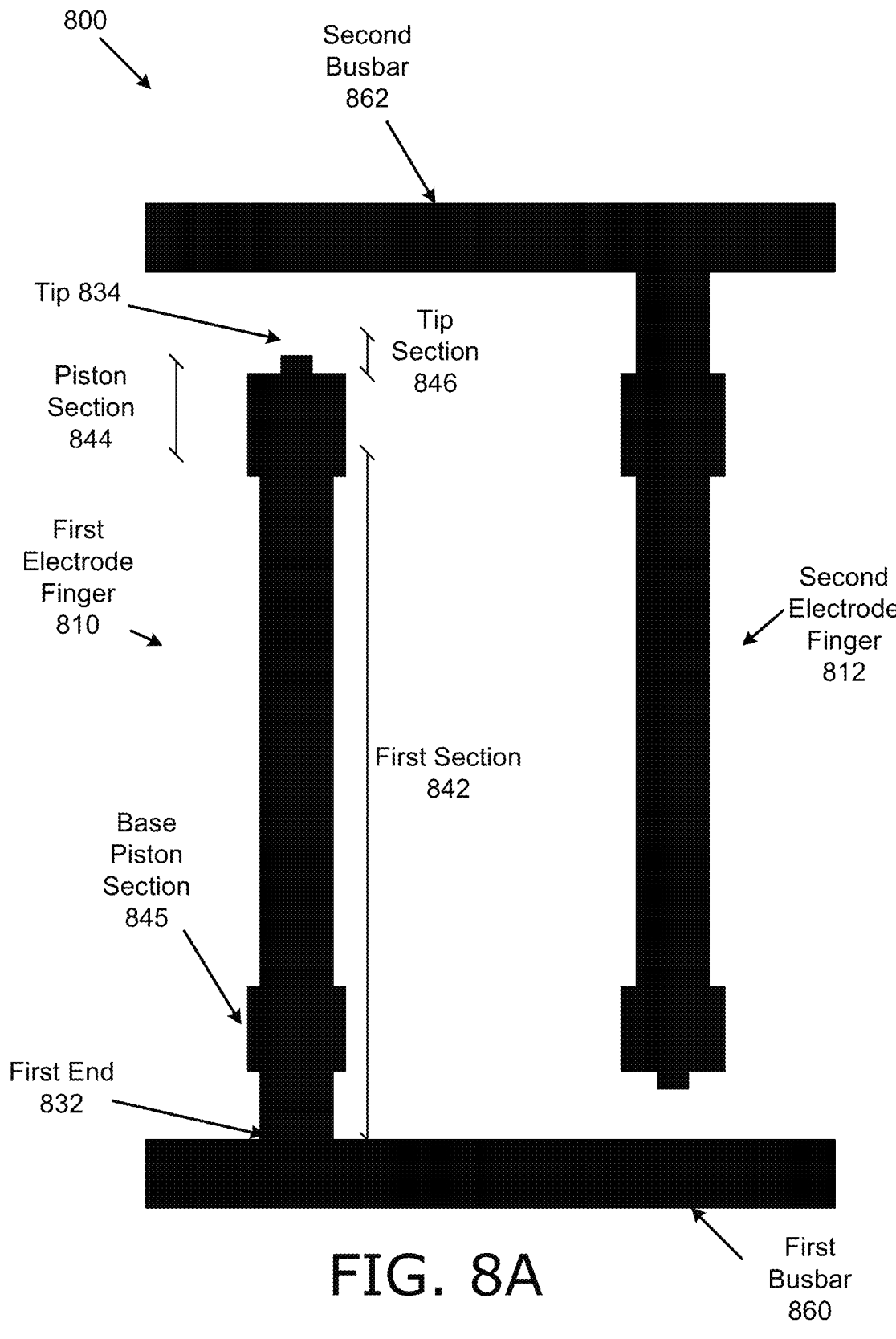
FIG. 8A is a representation of an electroacoustic resonator illustrating aspects of harmonic suppression structures, in accordance with aspects described herein.

FIG. 8A is a representation of an electroacoustic resonator 800 illustrating aspects of harmonic suppression structures, in accordance with aspects described herein. FIG. 8A illustrates two interleaved electrode fingers, shown as a first electrode finger 810 coupled to a first busbar 860, and a second electrode finger 812 coupled to a second busbar 862. In accordance with the detail provided above, the electroacoustic resonator 800 will include additional electrode fingers, but the illustrated two electrode fingers are shown to provide detail of the aspects described herein.

As shown, the first electrode finger 810 has a first end 832 coupled to the first busbar 860 and an electrode tip 834 positioned away from the first busbar 860 in a direction approximately perpendicular to the first busbar 860. The first electrode finger 810 further is made up of a first section 842, a piston section 844, and a tip section 846. The first section 842 can include a base piston section 845. The piston section 844 of the first electrode finger 810 can be aligned with a base piston section of the second electrode finger and the base piston section 845 can align with a piston section of the second electrode fingers to form trap regions (e.g., similar to the trap regions 427a and 427b). Further, in some aspects, additional apodization can be applied. In such aspects, once apodization is used on top of the piston mode design, the alignment of the trap regions no longer exists.

As indicated above, the section between such trap regions and associated busbars can include gap reflectors (e.g., the gap reflectors 720 and 722). For simplicity, such gap reflectors are not illustrated in FIGS. 8A-B and 9A-D. Additionally, as illustrated, the piston section 844 is shown with a wider width than the width of the first section 892. In other aspects, the piston section can be created by an increased material thickness, by a dielectric mass loading on the piston section 844, or by other such structures.

In the electroacoustic resonator 800 of FIG. 8A, the first section 842 extends from the first end 832 to a first piston section 844 interface. The piston section 844 extends from the first piston section interface to a second piston section interface with the tip section 846, and the tip section 846 extends from the second piston section interface with the piston section 844 to the electrode tip 834 in a direction perpendicular to the busbar. The tip section 846 may have a width that is smaller than both the piston section 844 and the central section. Additionally, in various aspects, the second piston section interface 884 for a particular finger can be associated with a width change or a geometry change between the structure of the tip section 846 and the piston section 884.

Figure 8B:
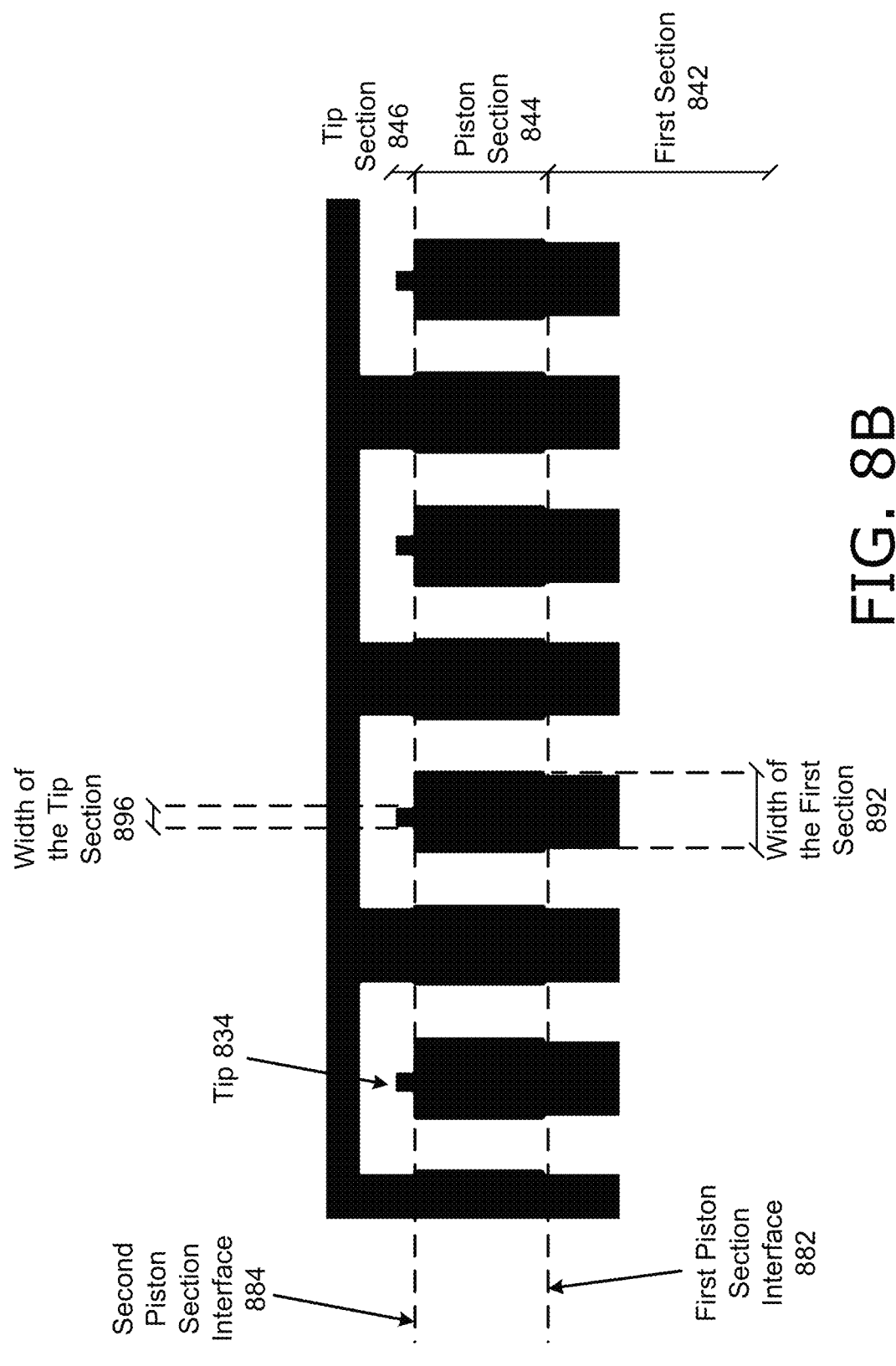
FIG. 8B is a representation of an electroacoustic resonator illustrating aspects of harmonic suppression structures, in accordance with aspects described herein.

FIG. 8B is a representation of the electroacoustic resonator 800 illustrating aspects of harmonic suppression structures, in accordance with aspects described herein. As shown, FIG. 8B includes a closer view with additional details of the electroacoustic resonator 800. In addition to showing the first section 842, the piston section 844, the tip section 846, and the electrode tip 834, FIG. 8B includes labels for a first piston section interface 882, a second piston section interface 884, a width of the first section 892, and a width of the tip section 896.

As indicated above and further detailed in FIG. 8B, in the electroacoustic resonator 800, the first section 842 extends from the first end 832 to a first piston section 844 interface 882. The piston section 844 extends from the first piston section interface 882 to a second piston section interface 884 with the tip section 846, and the tip section 846 extends from the second piston section interface 884 with the piston section 844 to the electrode tip 834 in a direction perpendicular to the busbars 860 and 862. In accordance with some aspects herein for harmonic suppression, the width of the tip section 896 at a widest position of the tip section 846 is narrower than the width of the first section 892 at a narrowest position of the first section 842.

The illustrated implementation of the resonator 800 includes a small rectangular stub for the tip section 846. In other aspects, other shapes can be used for the tip section 846, so long as the width of the tip section 896 is narrower than the width of the first section 892. For example, triangular geometries, pointed geometries, or other such geometries can be used where the width of the finger at the second piston section interface 884 or another portion of the tip section 846 does not exceed a widest width of the first section 842.

Figure 9A:
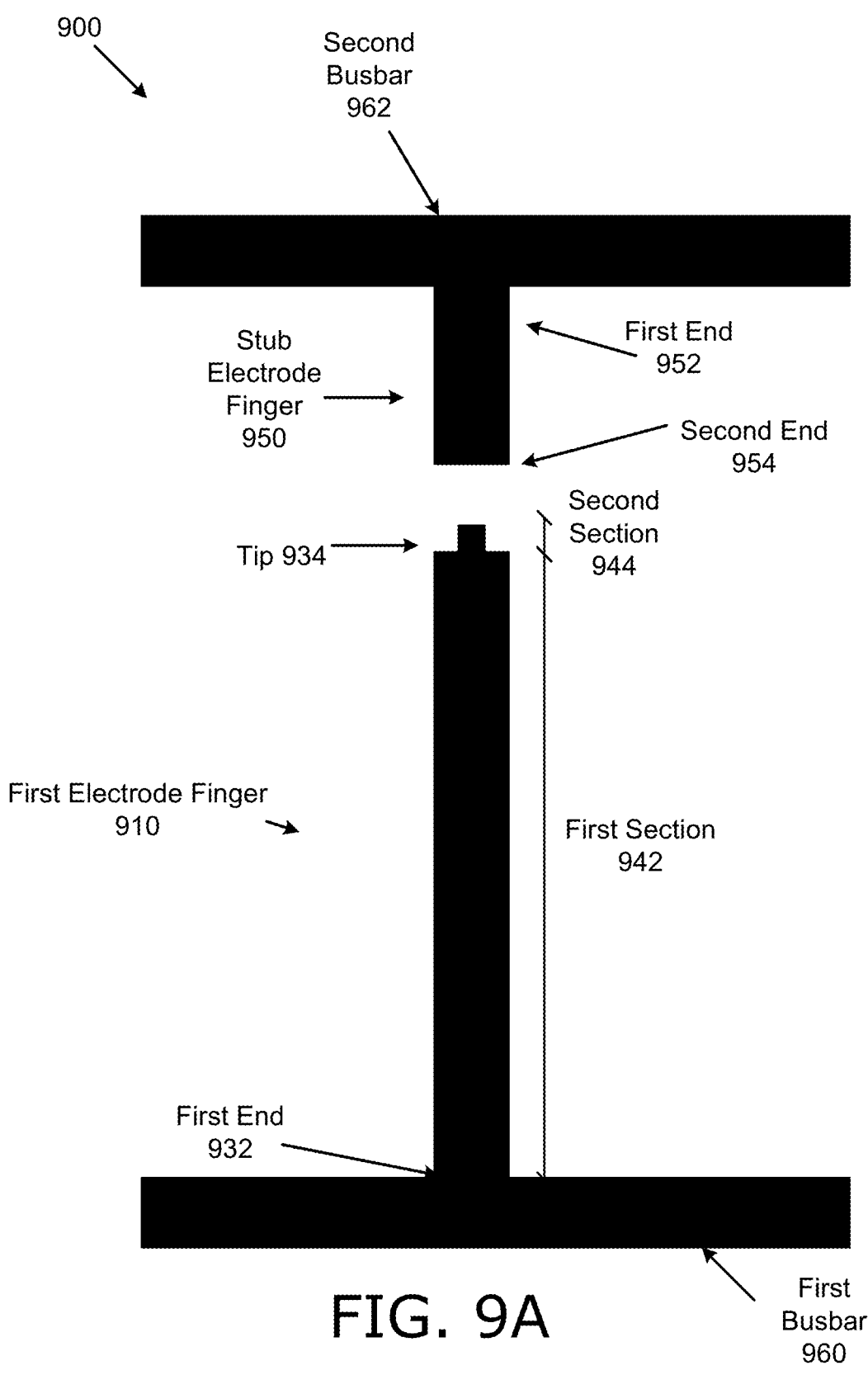
FIG. 9A is a representation of an electroacoustic resonator illustrating aspects of harmonic suppression structures, in accordance with aspects described herein.

FIG. 9A is a representation of an electroacoustic resonator 900 illustrating aspects of harmonic suppression structures, in accordance with aspects described herein. In some aspects, electroacoustic resonators can include electrode fingers aligned with stub electrode fingers positioned on a same shared line with the electrode fingers, such that tips of electrode fingers face tips of stub fingers, rather than opposite side busbars (e.g., FIGS. 8A and 8B) or gap reflectors (e.g., FIGS. 7A and 7B). Such stub electrode fingers can further be used to tune frequency response performance in some implementations. The electroacoustic resonator 900 of FIG. 9A includes a first electrode finger 910 in addition to a stub electrode finger. Just as in the examples above, the electroacoustic resonator 900 can include additional interleaved fingers and stub fingers with an alternating orientation from adjacent fingers (e.g., with the first electrode finger 910 adjacent to two stub fingers and the stub electrode finger 950 adjacent to two electrode fingers). Such adjacent structures are not shown in FIG. 9A for simplicity.

The electroacoustic resonator 900 includes a first busbar 960 and a second busbar 962 approximately parallel to the first busbar. The first electrode finger 910 is coupled to the first busbar 960 and extends in a first direction towards the second busbar 962 without touching the second busbar. The first electrode finger 910 further comprises a first section 942 coupled to the first busbar 960 at a first end 932. The first electrode finger 910 further comprises a second section 944 having a finger tip 934 having a first shape.

The electroacoustic resonator 900 additionally includes a first stub electrode finger 950 coupled to the second busbar 962 and extending in a second direction opposite the first direction towards the finger tip 934 of the first electrode finger 910. The first stub electrode finger 950 has a first end 952 coupled to the second busbar 962 and a second end 954. The second end 954 faces the tip 934 of the second section 944 of the first electrode finger. In accordance with harmonic suppression aspects described herein, the second end 954 of the stub electrode finger 950 ends with a second shape different than the first shape of the tip 934. In some aspects, the second end 954 has a stub tip with a shape different from the shape of other portions of the stub electrode finger 950. In other aspects, the stub tip (e.g., the end of the second end 954 of the stub electrode finger 950) can be a flat rectangular end of a rectangular stub finger, so long as this end is a different shape than the tip 934 of the second section 944 of the first electrode finger 910.

Figure 9B:
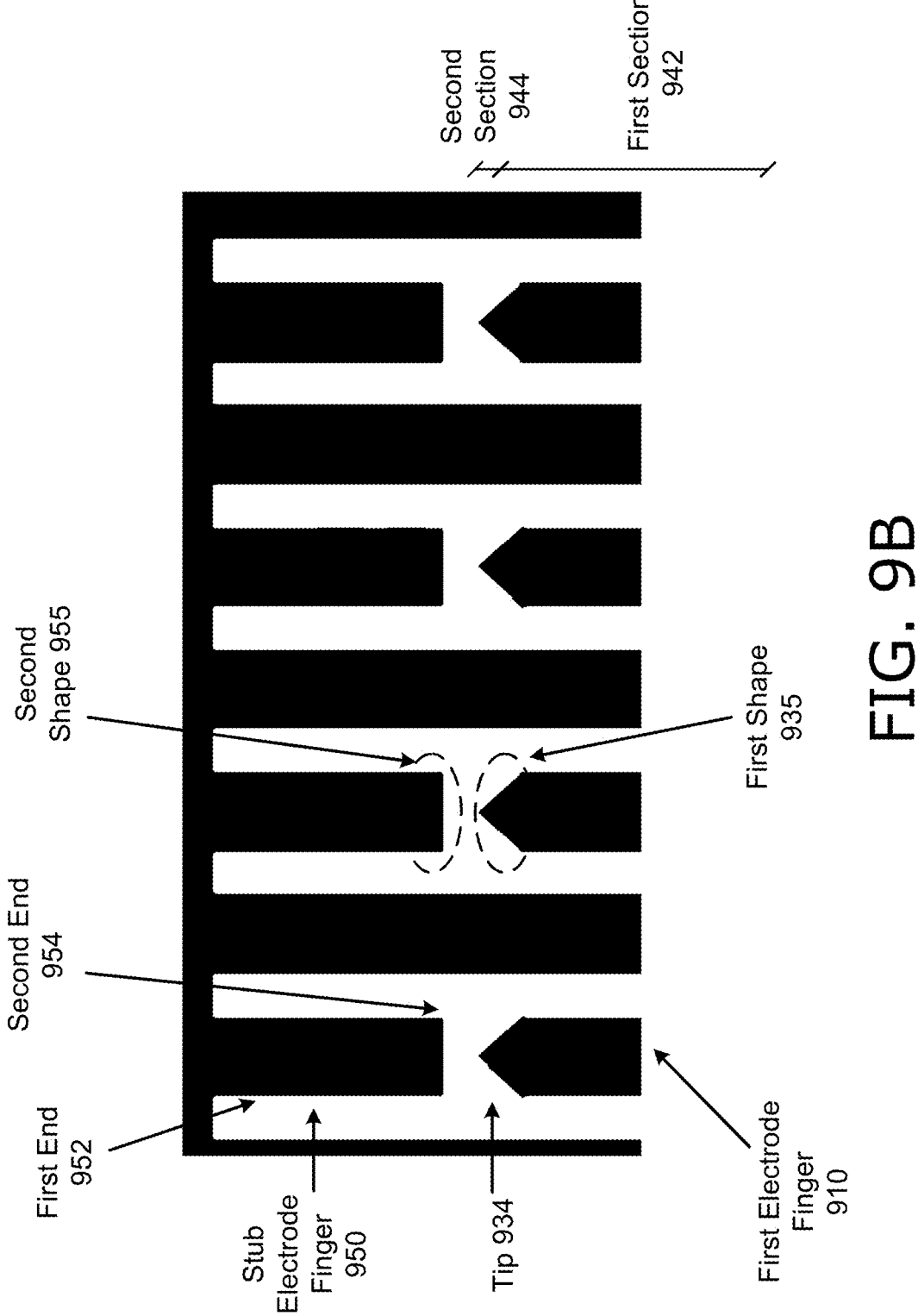
FIG. 9B is a representation of an electroacoustic resonator illustrating aspects of harmonic suppression structures, in accordance with aspects described herein.

FIG. 9B is a representation of the electroacoustic resonator 900 illustrating aspects of harmonic suppression structures, in accordance with aspects described herein. In addition to showing the stub electrode finger, the first electrode finger 910, along with the first end 952 and the second end 954 of the stub electrode finger and the first section 942, the second section 944, and the tip 934 of the first electrode finger, FIG. 9B shows portions of adjacent electrode fingers, along with a different shape for the tip 934 of the first electrode finger 910.

As illustrated, alternating electrode fingers including the first electrode finger 910 include a first shape 935 at the electrode tip 934. Similarly, the stub electrode finger 950 and alternating stubs include a second shape 955 at the second end 954. A similar configuration will be present at the other side of the electroacoustic resonator 900, including stub electrode fingers and shape tips for the electrodes adjacent to the first electrode finger 910 (with only the base section shown in FIG. 9B) and for alternating fingers (e.g., every other electrode finger). In FIG. 9B, the first shape 935 is a triangular shape, and the second shape 955 is a flat rectangular shape.

Figure 9C:
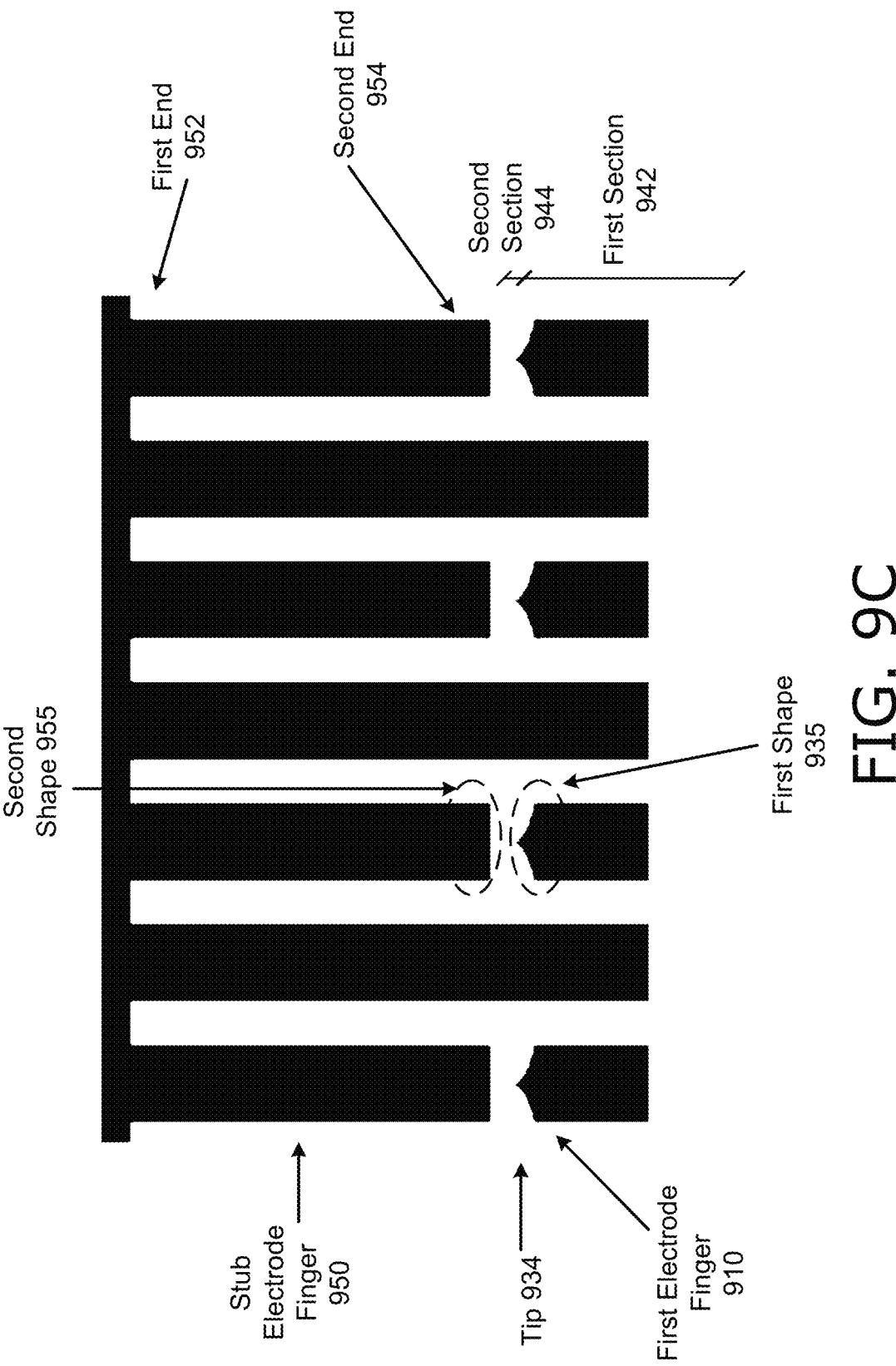
FIG. 9C is a representation of an electroacoustic resonator illustrating aspects of harmonic suppression structures, in accordance with aspects described herein.
Figure 9D:
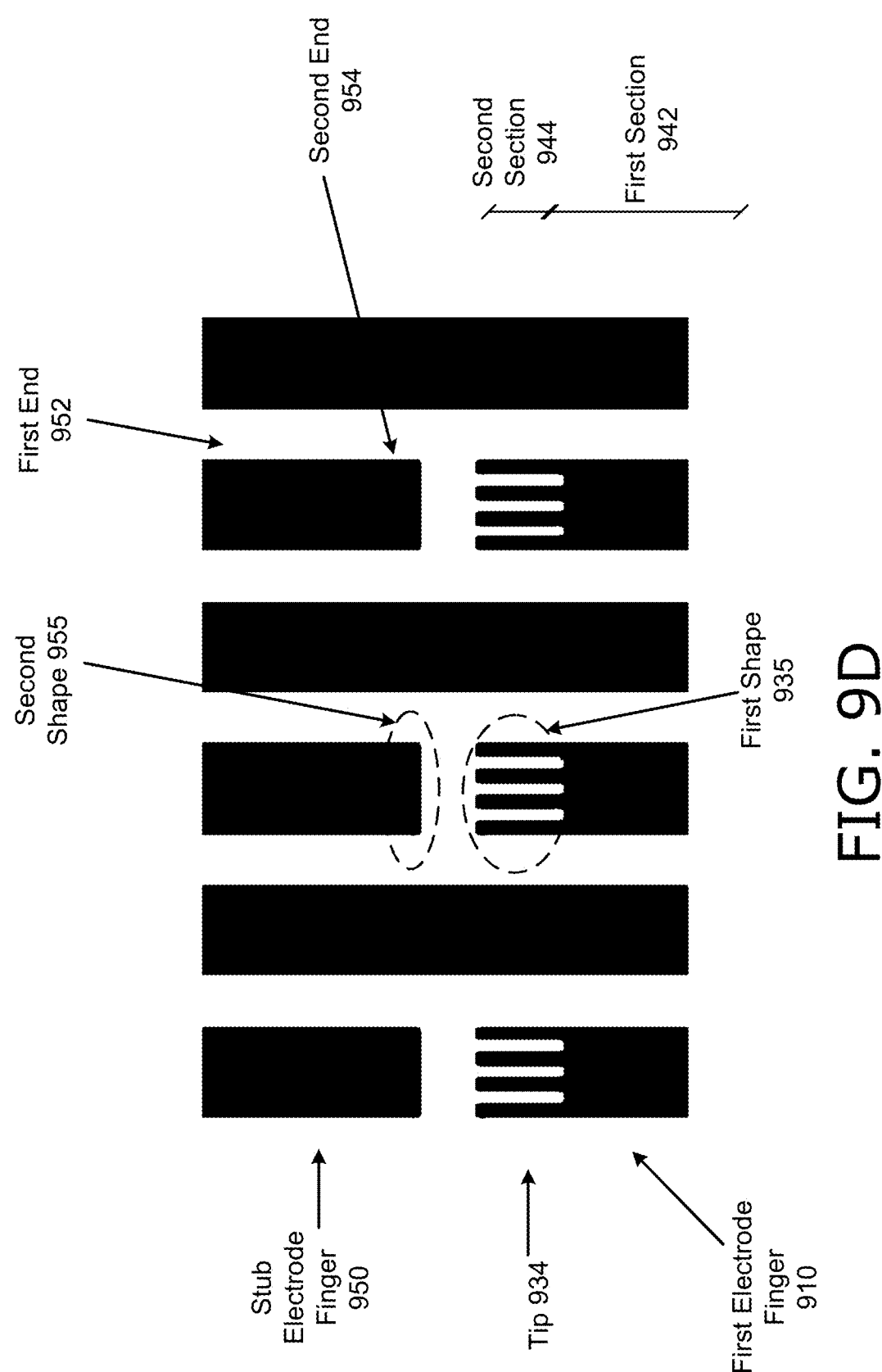
FIG. 9D is a representation of an electroacoustic resonator illustrating aspects of harmonic suppression structures, in accordance with aspects described herein.

Similar to FIG. 9B, FIGS. 9C and 9D are representations of the electroacoustic resonator 900 illustrating aspects of harmonic suppression structures, in accordance with aspects described herein. In particular, FIG. 9C illustrates an implementation where the first shape 935 is made up of two curves intersecting in a point of the tip 934, and FIG. 9D illustrates an implementation where the first shape 935 is made up of multiple rectangular stub shapes. In other aspects, other combinations of shapes can be used. For example, in one implementation, the first shape illustrate in FIG. 9B can be used as the second shape in the implementation of FIG. 9C, with a triangular shape for the second shape 955 and the pointed shape used for the first shape 935. In other aspects, other shapes can be used. For example, in one aspect, a rectangular stub similar to one of the four rectangular stubs can be used for the first shape 935, and a rectangular stub offset in any direction can be used for the second shape. Similarly, in one aspect, the first shape 935 can include a single stub (e.g., similar to the shape illustrated in FIG. 8A), and the second shape 935 can include two or more stubs separated from one another by gaps (e.g., similar to the four stub implementation of FIG. 9D).

In accordance with the details provided herein, any such aspect with differing finger and stub shapes can be used with piston sections for harmonic suppression, (e.g., with the first electrode finger 910 further comprises a first piston section proximate to the finger tip 934 between the first section 942 and the second section 944). Such piston sections can be fabricated in a variety of ways, including by use of a wider electrode in the piston section (e.g., as illustrated in FIG. 8A and FIG. 8B), using a greater thickness of metal in the piston section, using an additional material on a metallization layer (e.g., a dielectric layer) in the piston section, or any other such mechanism for modifying the metallization layer in a piston section.

Figure 10:
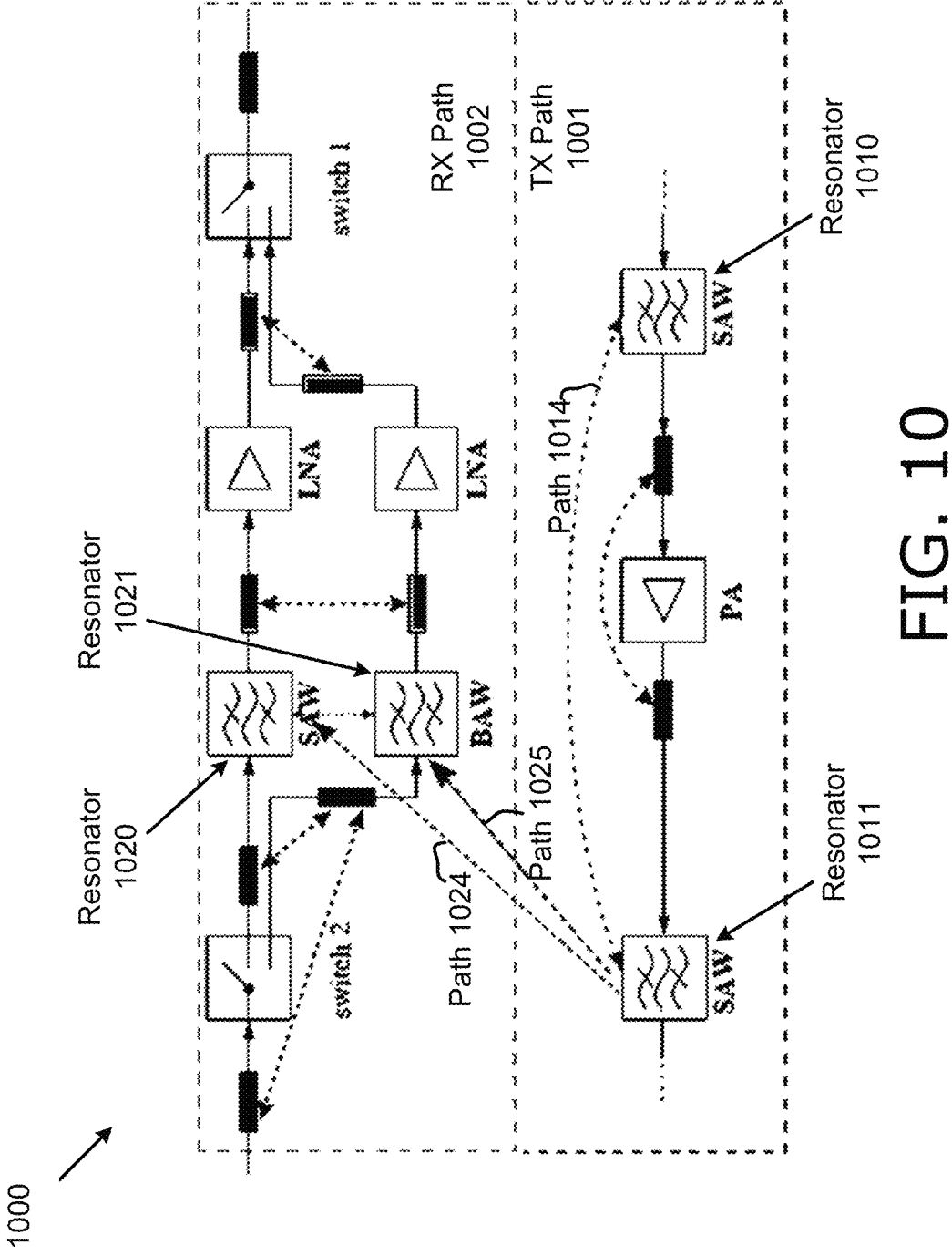
FIG. 10 is a representation of a wireless communication apparatus including an electroacoustic resonator for harmonic suppression, in accordance with aspects described herein.

Such an electroacoustic resonator can then be integrated within a communication device. For example, in some aspects, the electroacoustic resonator 900 or any other such electroacoustic resonator can be implemented as part of a transmission path of a wireless communication device. In one aspect, such a wireless communication device further includes an antenna, an amplifier, a first antenna path coupled between the first busbar and the antenna, and a first transmission path coupled from an output of the amplifier to the second busbar. FIG. 10 below illustrates another implementation example. It will be apparent that other implementations are possible within the scope of the aspects described herein.

The above illustrated electrode tip modifications for electroacoustic resonators can suppress harmonics by disrupting transversal fields that dominate nonlinear signal generation, and by disrupting cascading of such nonlinearities through a device (e.g., reinforcement of nonlinearities along a track such as the track 730). Aspects described herein modify these regions in order to reduce the second order nonlinearities and improve device performance. Such improvements can be provided with little or no increase in device area due to the modification of the device shape at the electrode tips rather than a change in the electrode finger size or configuration.

FIG. 10 is a representation of a wireless communication apparatus 1000 including electroacoustic resonators for harmonic suppression, in accordance with aspects described herein. The wireless communication apparatus 1000 includes a transmission path 1001 and a receive path 1002. As described above, harmonics from an electroacoustic resonator can be particularly disruptive to device performance near a transmission path 1001 output following power amplification of a signal, where the power through an electroacoustic resonator such as resonator 1011 can be relatively high. In operation with high power through the resonator 1011, harmonics from the resonator 1011 can travel via parasitic paths 1014, 1025 and 1024 to other electroacoustic resonators in a different path, such as resonator 1010, as well as resonator 1020 and resonator 1021 in the receive path 1002. The interference from the harmonics in such paths can interfere with electroacoustic signals not only in SAW resonators, but also other resonators such as BAW resonators. Suppression of second harmonics in a device as described above, using electrode finger tip modifications in accordance with aspects described herein, can suppress noise from such sources within a design. Electroacoustic resonators in accordance with aspects described herein having modified electrode tips for harmonic suppression can improve device operation, particularly in the context of cascaded resonators which results in parasitic harmonics and degraded performance in RF front end modules of communication devices.

Figure 11:
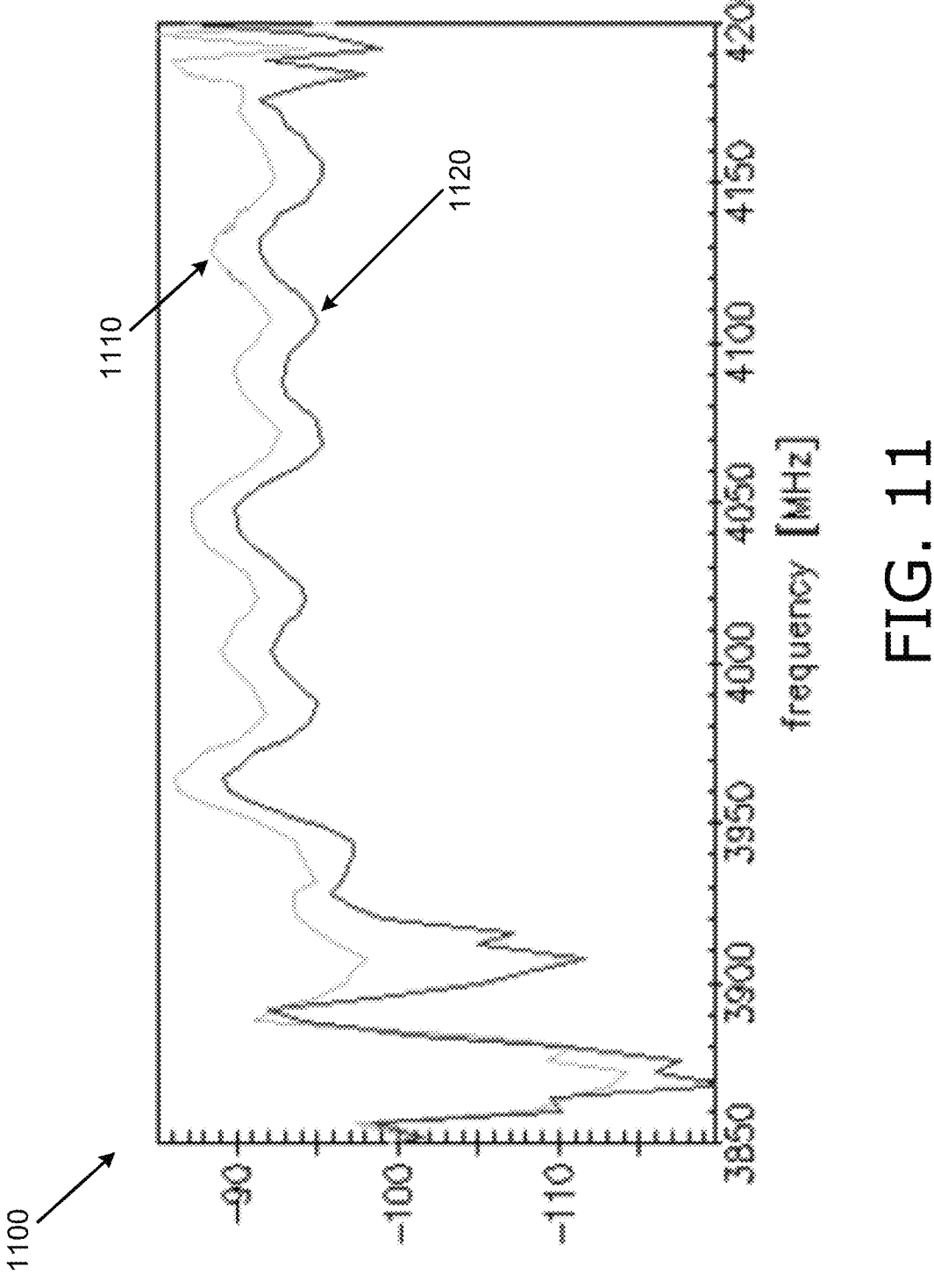
FIG. 11 is a chart illustrating improvements in device performance of a wireless communication with an electroacoustic resonator including harmonic suppression, in accordance with aspects described herein.

FIG. 11 is a chart 1100 illustrating improvements in device performance of a wireless communication with an electroacoustic resonator including harmonic suppression, in accordance with aspects described herein. The chart 1100 illustrates an example of frequency on the horizontal axis charted against second harmonic power in the vertical axis. The line 1110 shows a curve for an electroacoustic resonator without improvements in accordance with aspects described herein. The line 1120 shows a curve for an electroacoustic resonator with a modified tip similar to the aspects illustrated in FIG. 8A. The line 1110 shows additional power in the second harmonics across the illustrated frequency spectrum without the tip modification illustrated in accordance with aspects described herein. By contrast, the line 1120 shows significant suppression of the second harmonic power associated with tip modifications in accordance with various aspects described herein. The chart 1100 is one example modeled with one aspect described herein. Different aspects can be used in different device designs in accordance with various manufacturing and performance targets and limitations for a particular device implementation.

The shapes above in FIGS. 8A-B and 9A-D illustrate clean lines. Electrode fingers can be fabricated at or near the limits of certain manufacturing processes, resulting in variations due to the manufacturing processes. In some aspects, the shapes illustrated can be associated with mask shapes used to fabricate a metallization layer of an interdigital transducer. For example, in some aspects, a tip shape can be fabricated using a rectangular stub shape on a tip area of a mask, with the resulting shape of the metallization layer having a shape due to the rectangular mask in a tip area, but not being rectangular due to manufacturing process variations. In some aspects, optical proximity correction can be used during manufacturing of masks to pre-distort the mask and generate more accurate wafer results for small geometries (e.g., in a tip section such as the tip section 846 with a width 896 configured at the limits of a given manufacturing process.

FIG. 12 illustrates a method 1200 for fabricating a resonator in accordance with aspects described herein. In some aspects, the method 1200 is implemented by a system including a memory and one or more processors configured to perform operations indicated by the method 1200. In some aspects, the method 1200 is implemented via a non-transitory computer readable storage medium comprising instructions that, when executed by one or more processors of a device, cause the device to perform operations of the method 1200.

As illustrated by FIG. 12, the method 1200 includes block 1202, which describes fabricating a metallization layer mask, the metallization layer mask comprising: a first electrode finger shape extending in a first direction and having a first end coupled to a first busbar section and a second end, wherein the second end comprises a finger tip having a first shape; and a first stub electrode finger shape extending in a second direction opposite the first direction towards the finger tip of the first electrode finger shape, wherein the first stub electrode finger shape comprises a first end coupled to a second busbar section and a second end, and wherein the second end comprises a stub tip having a second shape different than the first shape.

The method 1200 also includes block 1204, which describes fabricating a metallization layer of the electroacoustic resonator using the metallization layer mask.

As detailed above, in some aspects, the method 1200 may be implemented using pre-distortion to fabricate shapes using pre-distorted shapes in the mask to fabricate the desired shapes in the metallization layer.

Additional illustrative aspects of the disclosure include:

Aspect 1. An electroacoustic resonator comprising: a first busbar; a second busbar; a first electrode finger coupled to the first busbar and extending in a first direction towards the second busbar without touching the second busbar, wherein the first electrode finger comprises a finger tip having a first shape; and a first stub electrode finger coupled to the second busbar and extending in a second direction opposite the first direction towards the finger tip of the first electrode finger, wherein the first stub electrode finger comprises a first end coupled to the second busbar and a second end, and wherein the second end comprises a stub tip having a second shape different than the first shape.

Aspect 2. The electroacoustic resonator of Aspect 1, wherein the first shape is a rectangular shape.

Aspect 3. The electroacoustic resonator of Aspect 2, wherein the first shape comprises multiple rectangular stub shape including the rectangular shape.

Aspect 4. The electroacoustic resonator of any of Aspects 1 through 3, wherein the first shape is a triangular shape.

Aspect 5. The electroacoustic resonator of any of Aspects 1 through 4, wherein the first shape comprises curves intersecting in a point of the finger tip.

Aspect 6. The electroacoustic resonator of any of Aspects 1 through 5, wherein the first electrode finger further comprises a first piston section proximate to the finger tip between a first section and a second section of the first electrode finger.

Aspect 7. The electroacoustic resonator of Aspect 6, wherein the first piston section comprises an area of additional thickness compared with a thickness of the first section of the first electrode finger.

Aspect 8. The electroacoustic resonator of Aspect 6, wherein the first piston section comprises an area of additional width compared with a width of the first section of the first electrode finger.

Aspect 9. The electroacoustic resonator of any of Aspects 1 through 8, further comprising: first gap reflectors parallel to the first busbar and extending in a direction different than the first electrode finger, wherein the first gap reflectors intersect the first electrode finger in a gap between the first busbar and fingers that extend towards the first busbar.

Aspect 10. The electroacoustic resonator of Aspect 9, further comprising: second gap reflectors extending in a direction different than the first stub electrode finger, wherein the second gap reflectors intersect the first stub electrode finger in a gap between the second busbar and the first electrode finger.

Aspect 11. The electroacoustic resonator of any of Aspects 1 through 10, wherein the electroacoustic resonator is part of a transmission or reception path of a wireless communication device, and wherein the wireless communication device further comprises: an antenna; and an amplifier.

Aspect 12. An electroacoustic resonator comprising: an electrode finger comprising a first end coupled to a busbar and an electrode tip positioned away from the busbar in a direction approximately perpendicular to the busbar, the electrode finger further comprising a first section, a piston section, and a tip section; wherein the first section extends from the first end to a first piston section interface; wherein the piston section extends from the first piston section interface to a second piston section interface; and wherein the tip section extends from the second piston section interface to the electrode tip in a direction perpendicular to the busbar, wherein a width of the tip section at a widest position of the tip section is narrower than a width of the first section at a narrowest position of the first section.

Aspect 13. The electroacoustic resonator of Aspect 12, wherein the tip section has a rectangular shape.

Aspect 14. The electroacoustic resonator of Aspect 13, wherein the tip section comprises multiple rectangular stub shape including the rectangular shape.

Aspect 15. The electroacoustic resonator of Aspect 12, wherein the tip section has a triangular shape.

Aspect 16. The electroacoustic resonator of Aspect 12, wherein the tip section comprises curves intersecting in a point of the finger tip.

Aspect 17. The electroacoustic resonator of any of Aspects 12 through 16, further comprising: gap reflectors parallel to the busbar and extending in a direction different than the electrode finger, wherein the gap reflectors intersect the first electrode finger in a gap between the busbar and electrode fingers that extend towards the busbar without touching the busbar.

Aspect 18. The electroacoustic resonator of any of Aspects 12 through 17, wherein the electroacoustic resonator is part of a transmission or reception path of a wireless communication device, and wherein the wireless communication device further comprises: an antenna; and an amplifier.

Aspect 19. A method of manufacturing an electroacoustic resonator, the method comprising: fabricating a metallization layer mask, the metallization layer mask comprising: a first electrode finger shape extending in a first direction and having a first end coupled to a first busbar section and a second end, wherein the second end comprises a finger tip having a first shape; and a first stub electrode finger shape extending in a second direction opposite the first direction towards the finger tip of the first electrode finger shape, wherein the first stub electrode finger shape comprises a first end coupled to a second busbar section and a second end, and wherein the second end comprises a stub tip having a second shape different than the first shape; and fabricating a metallization layer of the electroacoustic resonator using the metallization layer mask.

Aspect 20. The method of Aspect 19, wherein the metallization layer mask comprises a pre-distortion pattern used to generate the second shape of the second end.

Aspect 21. An electroacoustic resonator comprising: a first busbar; a second busbar approximately parallel to the first busbar; a first plurality of electrode fingers coupled to the first busbar and extending in a first direction towards the second busbar without touching the second busbar, each of the first plurality of electrode fingers having a first end coupled to the first busbar and a second end, wherein the second end comprises a finger tip; a second plurality of electrode fingers coupled to the second busbar and extending in a second direction toward the first busbar without touching the first busbar, each of the second plurality of electrode fingers having a first end coupled to the second busbar and a second end, wherein the first plurality of electrode fingers and the second plurality of electrode fingers are interleaved; and a first plurality of stub electrode fingers coupled to the second busbar and extending in the second direction toward the first busbar, each of the first plurality of stub electrode fingers having a first end coupled to the second busbar and a second end, each of the first plurality of stub electrode fingers sharing a line with a corresponding electrode finger of the first plurality of electrode fingers and having a stub tip facing the finger tip of the corresponding electrode finger of the first plurality of electrode fingers, wherein a shape of each stub tip of the first plurality of stub electrode fingers is different than a shape of the finger tip of the corresponding electrode finger of the first plurality of electrode fingers.

Aspect 22. A method of manufacturing an electroacoustic resonator, the method comprising: fabricating a metallization layer mask, the metallization layer mask comprising: an electrode finger shape comprising a first end coupled to a busbar section and an electrode tip positioned away from the busbar section in a direction approximately perpendicular to the busbar section, the electrode finger shape further comprising a first section, and a tip section; wherein a width of the tip section at a widest position of the tip section is narrower than a width of the first section at a narrowest position of the first section; and fabricating a metallization layer of the electroacoustic resonator using the metallization layer mask.

Aspect 23. A method for transmitting or receiving wireless signals using any apparatus above.

Aspect 24. A non-transitory computer readable medium comprising instructions that, when executed by a wireless communication device, causes the wireless communication device to transmit or receive signals using any apparatus or method described above.

Aspect 25. An apparatus comprising means for performing any operation described above.

Figure 13:
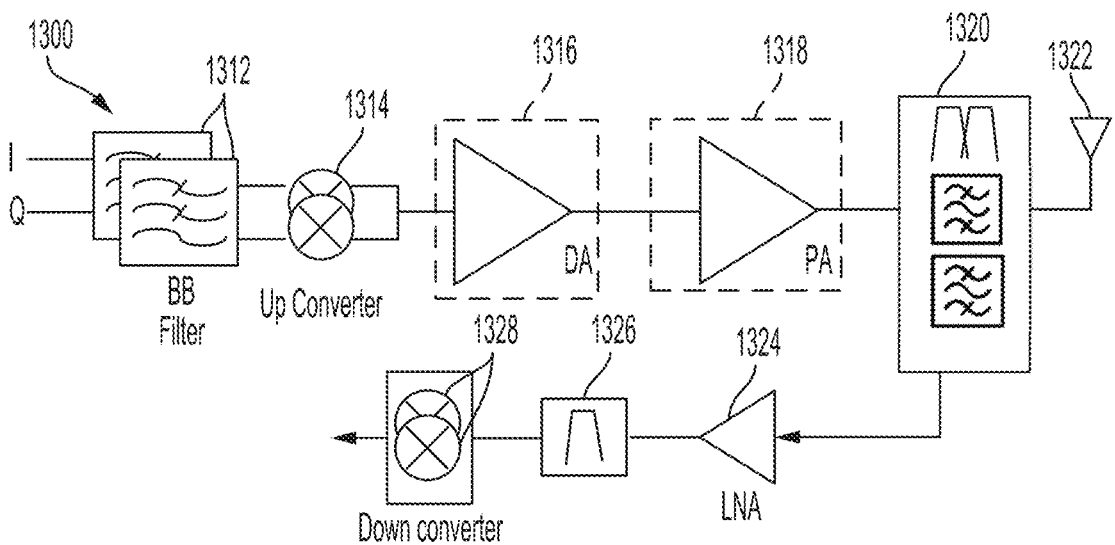
FIG. 13 illustrates a transceiver path that can include an electroacoustic resonator with harmonic suppression, in accordance with aspects described herein.

FIG. 13 is a functional block diagram of at least a portion of an example of a simplified wireless transceiver circuit 1300 in which a wireless communication apparatus having filters with harmonic suppression in accordance with aspects described above may be employed. The transceiver circuit 1300 is configured to receive signals/information for transmission (shown as I and Q values) which is provided to one or more base band filters 1312. The filtered output is provided to one or more mixers 1314. The output from the one or more mixers 1314 is provided to a driver amplifier 1316 whose output is provided to a power amplifier 1318 to produce an amplified signal for transmission. The amplified signal is output to the antenna 1322 through one or more filters 1320 (e.g., duplexers if used as a frequency division duplex transceiver or other filters). The one or more filters 1320 may include any filter circuit described herein, which can include one or more resonators in accordance with the details of the above description. The antenna 1322 may be used for both wirelessly transmitting and receiving data. The transceiver circuit 1300 includes a receive path through the one or more filters 1320 to be provided to a low noise amplifier (LNA) 1324 and a further filter 1326 and then down-converted from the receive frequency to a baseband frequency through one or more mixer circuits 1328 before the signal is further processed (e.g., provided to an analog digital converter and then demodulated or otherwise processed in the digital domain). There may be separate filters for the receive circuit (e.g., may have a separate antenna or have separate receive filters) that may be implemented using any filter circuit described herein.

Figure 14:
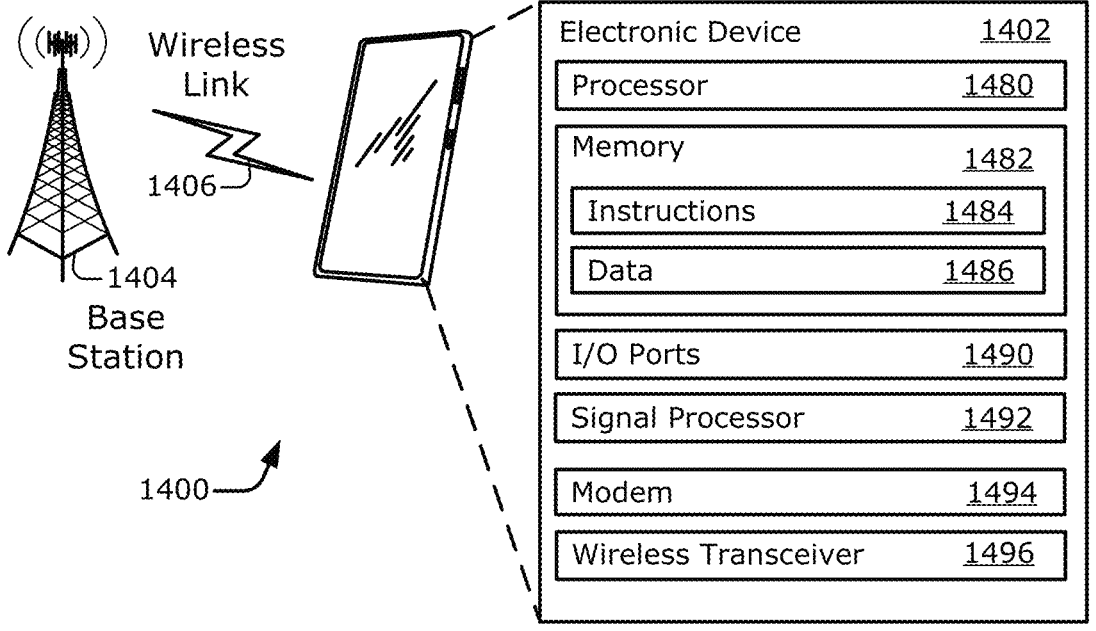
FIG. 14 is a diagram of an environment that includes a wireless communication device that can include a resonator with harmonic suppression for improved performance, in accordance with aspects described herein.

FIG. 14 is a diagram of an environment 1400 that includes an electronic device 1402 that includes a wireless transceiver 1496 such as the transceiver circuit 1300 of FIG. 13. In the environment 1400, the electronic device 1402 communicates with a base station 1404 through a wireless link 1406. As shown, the electronic device 1402 is depicted as a smart phone. However, the electronic device 1402 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1404 communicates with the electronic device 1402 via the wireless link 1406, which may be implemented as any suitable type of wireless link. Although depicted as a base station tower of a cellular radio network, the base station 1404 may represent or be implemented as another device, such as a satellite, terrestrial broadcast tower, access point, peer to peer device, mesh network node, fiber optic line, another electronic device generally as described above, and so forth. Hence, the electronic device 1402 may communicate with the base station 1404 or another device via a wired connection, a wireless connection, or a combination thereof. The wireless link 1406 can include a downlink of data or control information communicated from the base station 1404 to the electronic device 1402 and an uplink of other data or control information communicated from the electronic device 1402 to the base station 1404. The wireless link 1406 may be implemented using any suitable communication protocol or standard, such as 3rd Generation Partnership Project Long-Term Evolution (3GPP LTE, 3GPP NR 5G), IEEE 802.11, IEEE 802.16, Bluetooth™, and so forth.

The electronic device 1402 includes a processor 1480 and a memory 1482. The memory 1482 may be or form a portion of a computer readable storage medium. The processor 1480 may include any type of processor, such as an application processor or a multi-core processor, that is configured to execute processor-executable instructions (e.g., code) stored by the memory 1482. The memory 1482 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1482 is implemented to store instructions 1484, data 1486, and other information of the electronic device 1402, and thus when configured as or part of a computer readable storage medium, the memory 1482 does not include transitory propagating signals or carrier waves.

The electronic device 1402 may also include input/output ports 1490. The I/O ports 1490 enable data exchanges or interaction with other devices, networks, or users or between components of the device.

The electronic device 1402 may further include a signal processor (SP) 1492 (e.g., such as a digital signal processor (DSP)). The signal processor 1492 may function similar to the processor and may be capable executing instructions and/or processing information in conjunction with the memory 1482.

For communication purposes, the electronic device 1402 also includes a modem 1494, a wireless transceiver 1496, and an antenna (not shown). The wireless transceiver 1496 provides connectivity to respective networks and other electronic devices connected therewith using radio-frequency (RF) wireless signals and may include the transceiver circuit 1300 of FIG. 13. The wireless transceiver 1496 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

The various operations of methods described above may be performed by any suitable means capable of performing the corresponding functions. The means may include various hardware and/or software component(s) and/or module(s), including, but not limited to a circuit, an application-specific integrated circuit (ASIC), or processor. As part of such operations, methods described above can further include blocks to perform any additional functions described for operating an apparatus with harmonic suppression in accordance with examples described herein.

By way of example, an element, or any portion of an element, or any combination of elements described herein may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions or circuitry blocks described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer. In some aspects, components described with circuitry may be implemented by hardware, software, or any combination thereof.

Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An electroacoustic resonator comprising:
a first busbar;
a second busbar;
a first electrode finger coupled to the first busbar and extending in a first direction towards the second busbar without touching the second busbar, wherein the first electrode finger comprises a finger tip having a first shape; and
a first stub electrode finger coupled to the second busbar and extending in a second direction opposite the first direction towards the finger tip of the first electrode finger, wherein the first stub electrode finger comprises a first end coupled to the second busbar and a second end, and wherein the second end comprises a stub tip having a rectangular shape different than the first shape, wherein the finger tip extends into a portion of a gap region.

2. The electroacoustic resonator of claim 1, wherein the first shape is a rectangular shape.

3. The electroacoustic resonator of claim 2, wherein the first shape comprises multiple rectangular stub shape including the rectangular shape.

4. The electroacoustic resonator of claim 1, wherein the first shape is a triangular shape.

5. The electroacoustic resonator of claim 1, wherein the first shape comprises curves intersecting in a point of the finger tip.

6. The electroacoustic resonator of claim 1, wherein the first electrode finger further comprises a first piston section proximate to the finger tip between a first section and a second section of the first electrode finger.

7. The electroacoustic resonator of claim 6, wherein the first piston section comprises an area of additional thickness compared with a thickness of the first section of the first electrode finger.

8. The electroacoustic resonator of claim 6, wherein the first piston section comprises an area of additional width compared with a width of the first section of the first electrode finger.

9. The electroacoustic resonator of claim 1, further comprising:

first gap reflectors parallel to the first busbar and extending in a direction different than the first electrode finger, wherein the first gap reflectors intersect the first electrode finger in a gap between the first busbar and fingers that extend towards the first busbar.

10. The electroacoustic resonator of claim 9, further comprising:

second gap reflectors extending in a direction different than the first stub electrode finger, wherein the second gap reflectors intersect the first stub electrode finger in a gap between the second busbar and the first electrode finger.

11. The electroacoustic resonator of claim 1, wherein the electroacoustic resonator is part of a transmission or reception path of a wireless communication device, and wherein the wireless communication device further comprises:

an antenna; and
an amplifier.

12. An electroacoustic resonator comprising:

an electrode finger comprising a first end coupled to a busbar, the electrode finger further comprising a first section, a piston section, and a tip section; and a stub electrode finger extending towards the tip section, wherein the stub electrode finger comprises a stub tip having a rectangular shape;

wherein the first section extends from the first end to a first piston section interface;

wherein the piston section extends from the first piston section interface to a second piston section interface, wherein the piston section corresponds to a trap region; and wherein the tip section extends from the second piston section interface into a portion of a gap region in a direction perpendicular to the busbar, wherein a width of the tip section at a widest position of the tip section is narrower than a width of the first section at a narrowest position of the first section.

13. The electroacoustic resonator of claim 12, wherein the tip section has a rectangular shape.

14. The electroacoustic resonator of claim 13, wherein the tip section comprises multiple rectangular stub shape including the rectangular shape.

15. The electroacoustic resonator of claim 12, wherein the tip section has a triangular shape.

16. The electroacoustic resonator of claim 12, wherein the tip section comprises curves intersecting in a point of the tip section.

17. The electroacoustic resonator of claim 12, further comprising:

gap reflectors parallel to the busbar and extending in a direction different than the electrode finger, wherein the gap reflectors intersect the electrode finger in a gap between the busbar and electrode fingers that extend towards the busbar without touching the busbar.

18. The electroacoustic resonator of claim 12, wherein the electroacoustic resonator is part of a transmission or reception path of a wireless communication device, and wherein the wireless communication device further comprises:

an antenna; and
an amplifier.

19. The electroacoustic resonator of claim 1, wherein the finger tip comprises a first width, the first electrode finger and the first stub electrode finger comprise a second width, and the first width is less than the second width.

20. The electroacoustic resonator of claim 12, wherein the width of the tip section at the widest position of the tip section is narrower than a width of the first section.

\* \* \* \* \*